(12) United States Patent
Fowler, Jr. et al.

(10) Patent No.: US 9,867,300 B1
(45) Date of Patent: Jan. 9, 2018

(54) MULTIPLE CONDUCTOR CONTAINER

(71) Applicant: Southwire Company, LLC, Carrollton, GA (US)

(72) Inventors: Willie Franklin Fowler, Jr., Roopville, GA (US); Jeremy Harris, Villa Rica, GA (US); Richard Mike Temblador, Carrollton, GA (US); Juan Alberto Galindo Gonzalez, Powder Springs, GA (US)

(73) Assignee: Southwire Company, LLC, Carrolton, GA (US)

( * ) Notice: Subject to any disclaimer, the term of this patent is extended or adjusted under 35 U.S.C. 154(b) by 352 days.

(21) Appl. No.: 14/259,215

(22) Filed: Apr. 23, 2014

Related U.S. Application Data

(60) Continuation-in-part of application No. 13/938,454, filed on Jul. 10, 2013, now Pat. No. 9,145,219, which is a division of application No. 13/849,018, filed on Mar. 22, 2013, now Pat. No. 8,936,153, which is a continuation-in-part of application No. 13/464,168, filed on May 4, 2012, now abandoned.

(51) Int. Cl.
*H05K 5/02* (2006.01)
*B65H 51/00* (2006.01)

(52) U.S. Cl.
CPC ........... *H05K 5/0247* (2013.01); *B65H 51/00* (2013.01)

(58) Field of Classification Search
CPC ........... G01B 7/042; G01B 13/02; H01F 6/06; H02G 1/06; H02G 11/00; H02G 11/02; Y10T 29/49004; Y10T 29/53052; Y10T 29/53213; Y10T 29/53961; B65H 61/00; B65H 51/00; H05K 5/0247
See application file for complete search history.

(56) References Cited

U.S. PATENT DOCUMENTS

| 83,341 | A | 10/1868 | Towndrow |
|---|---|---|---|
| 745,833 | A | 12/1903 | Hanson |
| 1,403,404 | A | 1/1922 | Grumpelt |
| 1,649,940 | A | 11/1927 | Willmot |
| 1,915,843 | A | 6/1933 | Francis |
| 1,974,862 | A | 9/1934 | Cryan |
| 2,239,222 | A | 4/1941 | Funke |
| 2,249,051 | A | 7/1941 | Schulse |
| 2,330,909 | A | 10/1943 | Olson |
| 2,497,440 | A | 2/1950 | Denny |
| 2,580,900 | A | 1/1952 | Epstein |
| 2,610,812 | A | 9/1952 | Epstein |
| 2,620,997 | A | 12/1952 | Lyon |

(Continued)

OTHER PUBLICATIONS

U.S. Office Action dated May 1, 2015 cited in U.S. Appl. No. 14/016,364; 49 pages.

(Continued)

*Primary Examiner* — Carl Arbes
(74) *Attorney, Agent, or Firm* — Merchant & Gould P.C.

(57) ABSTRACT

A container may be provided. The container may comprise a first surface and a second surface concentric with the first surface. The first surface and the second surface may define a volume. The volume may house a concentric length of multiple parallel conductors. The multiple parallel conductors may pass through a restricting mechanism to restrict the multiple parallel conductors to pass at the same rate and at the same length.

32 Claims, 21 Drawing Sheets

(56) References Cited

U.S. PATENT DOCUMENTS

| | | |
|---|---|---|
| 2,713,938 A | 7/1955 | Snyder |
| 2,765,090 A | 10/1956 | Halls |
| 2,854,245 A | 9/1958 | Manahan |
| 2,869,719 A | 1/1959 | Hubbard |
| 2,903,147 A | 9/1959 | Davis, Jr. |
| 2,912,763 A | 11/1959 | Loewe et al. |
| 3,000,493 A | 9/1961 | Hirst |
| 3,081,893 A | 3/1963 | Holsclaw |
| 3,278,061 A | 10/1966 | Christensen |
| 3,298,631 A | 1/1967 | Richardson, Jr. |
| 3,369,687 A | 2/1968 | Walls |
| 3,473,489 A | 10/1968 | Sargent |
| 3,485,458 A | 12/1969 | Evans |
| 3,491,876 A | 1/1970 | Zecchin |
| 3,602,455 A | 8/1971 | Lewis |
| 3,642,301 A | 2/1972 | Crawford |
| 3,674,164 A | 7/1972 | Kaufman |
| 3,711,111 A | 1/1973 | Crawford |
| 3,722,825 A | 3/1973 | Phillips |
| 3,819,847 A | 6/1974 | Charles |
| 3,902,679 A | 9/1975 | Bost et al. |
| 4,018,468 A | 4/1977 | Lundquist |
| 4,213,536 A | 7/1980 | Hefner |
| 4,257,729 A | 3/1981 | Morissette |
| 4,444,313 A | 4/1984 | Tyson |
| 4,512,431 A | 4/1985 | Bloomfield |
| 4,582,198 A | 4/1986 | Ditton |
| 4,664,260 A | 5/1987 | Stokes |
| 4,680,068 A | 7/1987 | Hofstetter et al. |
| 4,741,659 A | 5/1988 | Berg |
| 4,981,412 A | 1/1991 | Hawkins |
| 5,022,603 A | 6/1991 | Maree et al. |
| 5,033,520 A | 7/1991 | Kuehmichel |
| D329,561 S | 9/1992 | Nyorkor |
| 5,277,314 A | 1/1994 | Cooper et al. |
| 5,499,775 A | 3/1996 | Vander Groef |
| 5,641,947 A | 6/1997 | Riddle, Jr. |
| 5,642,811 A | 7/1997 | Huebner et al. |
| 5,738,209 A | 4/1998 | Burr et al. |
| 5,746,380 A | 5/1998 | Chung |
| 5,758,834 A | 6/1998 | Dragoo et al. |
| 5,816,514 A | 10/1998 | Duclos et al. |
| 5,879,068 A | 3/1999 | Menashrov et al. |
| 5,967,362 A | 10/1999 | Corbin |
| 6,016,911 A | 1/2000 | Chen |
| 6,129,796 A | 10/2000 | Steinberg et al. |
| 6,209,725 B1 | 4/2001 | Chen |
| 6,530,584 B1 | 3/2003 | Lucy |
| 6,662,963 B1 | 12/2003 | Meike et al. |
| 6,702,077 B2 | 3/2004 | Skowronski |
| 6,966,701 B2 | 11/2005 | Schelbert |
| 7,025,300 B2 | 4/2006 | Glassey |
| 7,161,097 B1 | 1/2007 | Gorgone |
| 7,399,017 B1 | 7/2008 | Lasseigne |
| 7,798,180 B2 | 9/2010 | Kazuaki et al. |
| 7,866,586 B2 | 1/2011 | Fabian |
| 8,235,210 B2 | 8/2012 | De Lacerda et al. |
| 8,366,126 B2 | 2/2013 | Galgano et al. |
| 8,387,909 B2 | 3/2013 | Galgano et al. |
| 8,662,003 B1 | 3/2014 | Cooper et al. |
| 8,936,153 B1 | 1/2015 | Temblador et al. |
| 9,145,219 B1 * | 9/2015 | Temblador ............. B65B 35/00 |
| 9,796,494 B1 | 10/2017 | Temblador et al. |
| 2001/0006184 A1 | 7/2001 | Ohike |
| 2002/0113162 A1 | 8/2002 | Fournier |
| 2003/0230660 A1 | 12/2003 | Vemam |
| 2003/0230667 A1 | 12/2003 | Ganster |
| 2004/0177642 A1 | 9/2004 | Citrynell et al. |
| 2005/0074317 A1 | 4/2005 | Escorza |
| 2005/0127233 A1 | 6/2005 | Hsu et al. |
| 2005/0263640 A1 | 12/2005 | Vanderslice |
| 2007/0045141 A1 | 3/2007 | Gelmetti |
| 2007/0175786 A1 | 8/2007 | Nicklas |
| 2008/0023358 A1 | 1/2008 | Otto |
| 2008/0236102 A1 | 10/2008 | Murakami |
| 2010/0124476 A1 | 5/2010 | Berlinger |
| 2010/0164191 A1 | 7/2010 | Kinnen |
| 2011/0174763 A1 | 7/2011 | Kennedy |
| 2012/0168554 A1 | 7/2012 | Blunt et al. |
| 2012/0234713 A1 | 9/2012 | Nicklas |
| 2013/0032597 A1 | 2/2013 | Anderson |
| 2013/0119184 A1 | 5/2013 | Ma et al. |
| 2013/0313377 A1 | 11/2013 | Struck, II |
| 2013/0334166 A1 | 12/2013 | Garipalli et al. |
| 2015/0225205 A1 | 8/2015 | Fleury et al. |
| 2017/0063057 A1 | 3/2017 | Fowler, Jr. et al. |

OTHER PUBLICATIONS

U.S. Final Office Action dated May 26, 2016 cited in U.S. Appl. No. 13/464,168, 25 pgs.

U.S. Office Action dated May 14, 2014 cited in U.S. Appl. No. 13/938,454, 7 pages.

U.S. Appl. No. 14/865,441, filed Sep. 25, 2015 entitled "Method for Laying Multiple Conductors in a Container", Temblador et al.

U.S. Office Action dated Aug. 27, 2015 cited in U.S. Appl. No. 13/464,168, 26 pgs.

U.S. Final Office Action dated Feb. 3, 2015 cited in U.S. Appl. No. 13/464,168; 15 pages.

U.S. Final Office Action dated Dec. 17, 2015 cited in U.S. Appl. No. 14/016,364, 18 pgs.

U.S. Final Office Action dated May 31, 2017 cited in U.S. Appl. No. 14/016,364, 28 pgs.

U.S. Appl. No. 13/464,168, filed May 4,2012, Temblador, et al., entitled "Multiple Conductor Container".

U.S. Appl. No. 13/849,018, filed Mar. 22, 2013, Temblador, et al., entitled "Multiple Conductor Container".

U.S. Appl. No. 13/938,454, filed Jul. 10, 2013, Temblador, et al., entitled "Multiple Conductor Container".

U.S. Appl. No. 14/016,364, filed Sep. 3, 2013. Gonzalez, et al., entitled "Cart and Container".

U.S. Office Action dated Jul. 19, 2013 cited in U.S. Appl. No. 13/849,018, 22 pgs.

U.S. Final Office Action dated Nov. 1, 2013 cited in U.S. Appl. No. 13/849,018, 18 pgs.

U.S. Office Action dated Feb. 13, 2014 cited in U.S. Appl. No. 13/849,018, 20 pages.

U.S. Final Office Action dated Apr. 28, 2014 cited in U.S. Appl. No. 13/849,018; 19 pages.

U.S. Office Action dated May 8, 2014 cited in U.S. Appl. No. 13/464,168, 30 pages.

Copending U.S. Appl. No. 15/254,051, filed Sep. 1, 2016 entitled "Conductor Identification", Fowler et al.

U.S. Office Action dated Sep. 29, 2016 cited in U.S. Appl. No. 14/016,364, 21 pgs.

U.S. Office Action dated Dec. 2, 2016 cited in U.S. Appl. No. 14/865,441, 28 pgs.

Copending U.S. Appl. No. 15/789,100, filed Oct. 20, 2017 entitled "Method for Laying Multiple Conductors in Container".

* cited by examiner

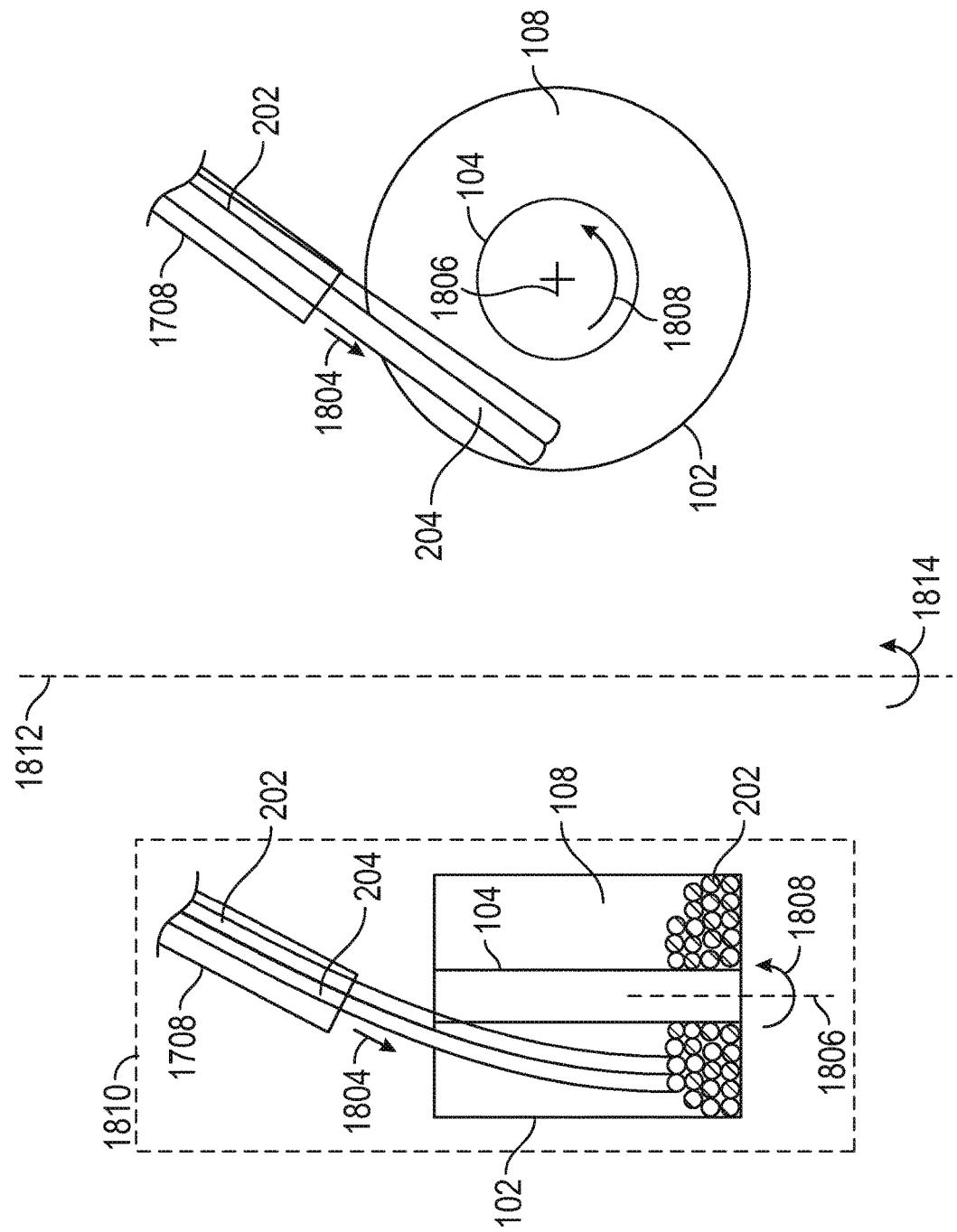

MULTIPLE CONDUCTOR CONTAINER

CROSS-REFERENCE TO RELATED APPLICATIONS

This application is a continuation-in-part (CIP) of U.S. application Ser. No. 13/938,454, filed Jul. 10, 2013, which is incorporated herein by reference. U.S. application Ser. No. 13/938,454 is a divisional application of U.S. application Ser. No. 13/849,018, filed on Mar. 22, 2013, which is incorporated herein by reference. U.S. application Ser. No. 13/849,018 is a continuation-in-part (CIP) of U.S. application Ser. No. 13/464,168, filed on May 4, 2012, which is incorporated herein by reference.

COPYRIGHTS

All rights, including copyrights, in the material included herein are vested in and the property of the Applicants. The Applicants retain and reserve all rights in the material included herein, and grant permission to reproduce the material only in connection with reproduction of the granted patent and for no other purpose.

BACKGROUND

With conventional systems, at least three electricians may be needed to install wire. One would pull and feed the wire from a reel holder, one would feed the wire and possible lubricate the wire into a conduit, and a third would pull the wire through the conduit. This method of installing wire is very labor intensive and strenuous as the electrician pulling wire from the reel holder may have to pull hard enough to overcome then stationary inertia of multiple reels hold 50 or more pounds of wire. For example, if there are seven reels with 50 pounds of wire on each reel, the electrician must pull with a force to overcome 3,500 pounds of stationary wire.

BRIEF DESCRIPTION OF THE DRAWINGS

The accompanying drawings, which are incorporated in and constitute a part of this disclosure, illustrate various embodiments of the present invention. In the drawings:

FIGS. 18A and 18B show a method and configuration for laying multiple conductors in a multiple conductor container assembly;

DESCRIPTION

Figure 1A:
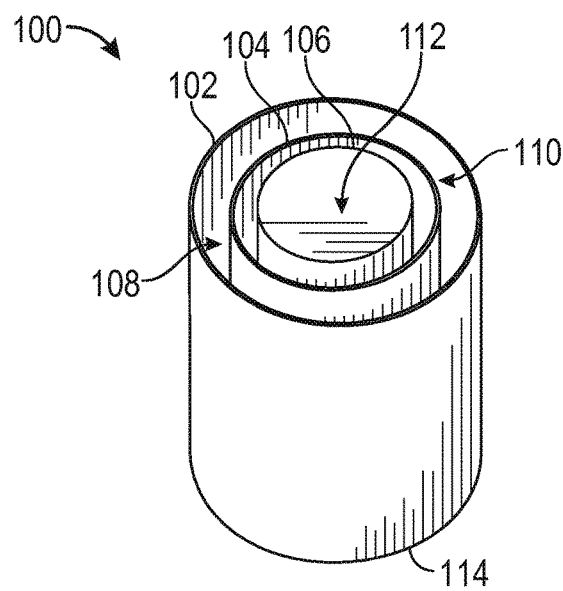
FIGS. 1A, 1B, and 1C show a multiple conductor container assembly.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention.

Consistent with embodiments of the invention, a container may be provided. The container may comprise a first surface and a second surface concentric with the first surface. The first surface and the second surface may define a volume. The volume may house a concentric length of multiple single conductors arranged in parallel.

With embodiments of the invention, multiple conductors may be non-bound, paralleled, cabled, twisted, non-twisted or bundled (e.g. with a binder) together and laid in a circular pattern in the container. Paralleled conductors may be conductors arranged such that they are substantially parallel to one another. A conductor may be any material that may conduct electricity, light, or any signal. Examples of a conductor may include copper wire, a data cable, a fiber optic cable, and aluminum wire.

An example of the container may be a barrel for housing multiple conductors. The circular pattern may be helically distributed horizontally within the container assembly with a center core and an outside diameter that is larger than the circular pattern effectively forming a horizontal layer. Moreover, each horizontal layer may be layered or stacked vertically. If the container assembly is layered and stacked, then an end user may be able to easily payoff the multiple conductors from the center of the container assembly without having to set up a reel, thus eliminating the need to lift reels and issues associated with paying off on reels. Additionally, a cart may be adapted or modified to allow the container to be secured, moved, and located where needed. For example, the container may be located near or equipped with a container tap wire guide that may center the conductors over the container and allows it to be pulled where needed.

FIG. 1A shows a multiple conductor container assembly 100 (e.g., a container) that may be used to store, transport, and feed a cable. Multiple conductor container assembly 100 may comprise a first surface (e.g., an outer wall 102), a second surface (e.g., a middle wall 104), and a third surface (e.g., an inner wall 106). Outer wall 102 and middle wall 104 may form a first volume 108 (e.g., a first cavity) and middle wall 104 and inner wall 106 may form a second volume 110

Figure 1B:
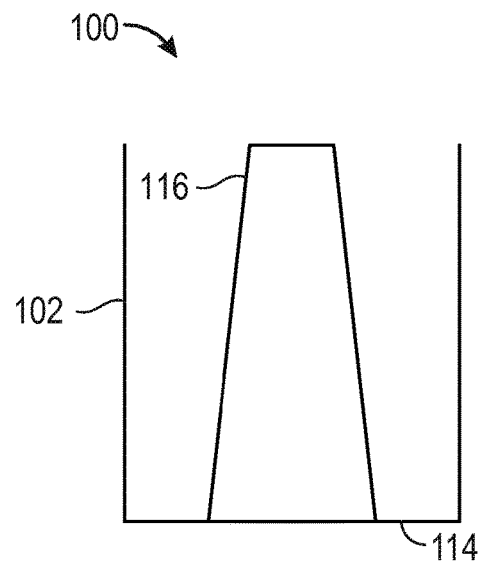
Figure 1C:
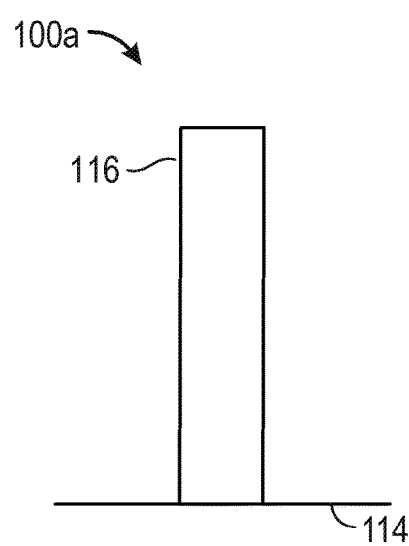

(e.g., a second cavity). Inner wall 106 may form a third volume 112 (e.g., a third cavity). Multiple conductor container assembly 100 may further comprise a bottom plate 114. While FIG. 1A shows middle wall 104 and inner wall 106 each having a cylindrical profile, as shown in FIG. 1B, an inner surface 116 may comprise a conical profile. In addition, as shown in FIG. 1C a multiple conductor assembly 100a may comprise bottom plate 114 and inner surface 116. The multiple conductors may be wrapped around inner surface 116.

As will be describe in greater detail below, first volume 108, second volume 110, and third volume 112 may be used to house and feed cables. Furthermore, items other than cables may be stored in the cavities. For instance, third volume 112 may include various materials such as an electrician's tools or other supplies (e.g., wire nuts, receptacle boxes, etc.). Moreover, any number of walls and any number of cavities may be used consistent with embodiments. Consistent with embodiments of the invention, any of the surfaces (e.g. first surface, a second surface, a third surface, etc.) may be solid, may contain holes, may have slots, may have spaces, and may form any structure (e.g. a frame structure.) The surfaces are not limited to being solid.

The cable may comprise a single conductor (e.g., THHN) or may have multiple conductors (e.g., MC cable, parallel cables, parallel conductors, multiple sets of bound cables, insulated, un-insulated, etc.). The multiple conductors may be unbound or may be bound together. The multiple conductors may be bound together by twisting the multiple conductors together, placing a binding wire or tape around the multiple conductors, or a jacket may be placed around the multiple conductors. In addition, the multiple conducts may laid in the multiple conductor container assembly 100 simultaneously.

Figure 2:
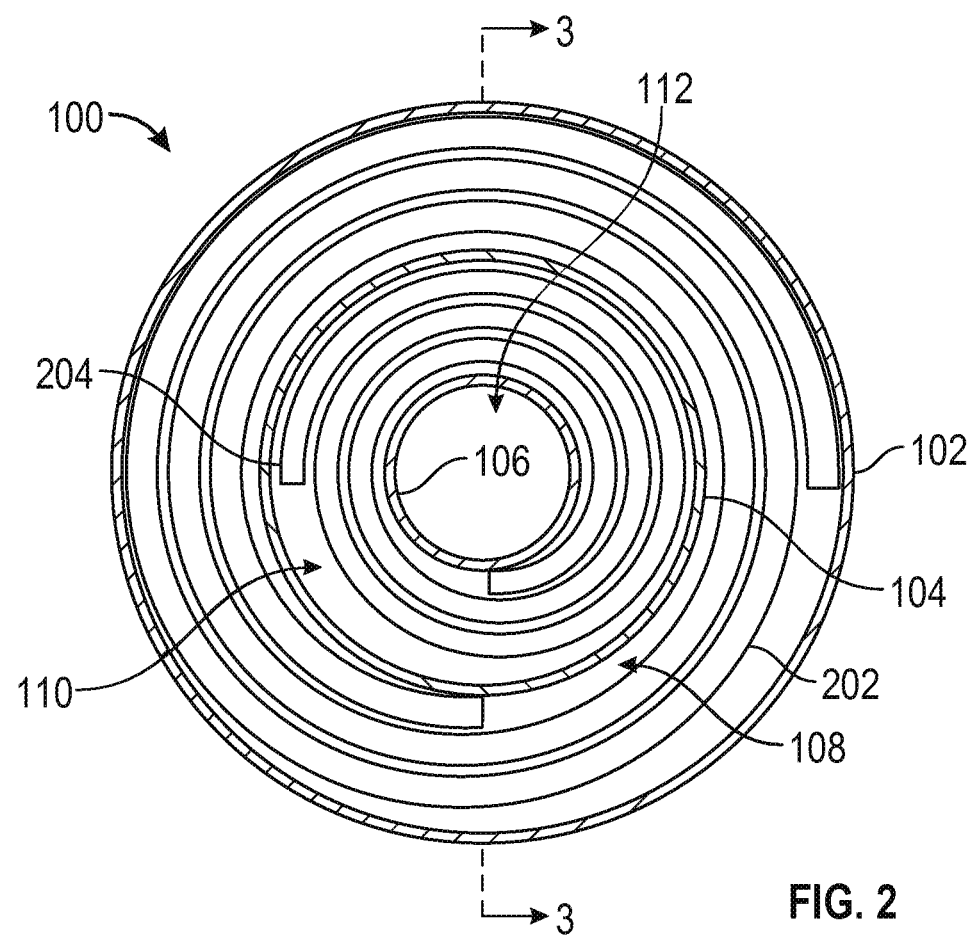
FIG. 2 shows a top view of the multiple conductor container assembly.

FIG. 2 shows top view of multiple conductor container assembly 100 having a first conductor 202 stored in first volume 108 and a second conductor 204 stored in second volume 110. First conductor 202 and second conductor 204 may be placed in multiple conductor container assembly 100 such that they form concentric circles. For instance, FIG. 2 shows first conductor 202 having a lay that forms counter-clockwise concentric circles and second conductor 204 having a lay that forms counter-clockwise concentric circles. While FIG. 2 shows first conductor 202 and second conductor 204 having the same lay direction, first conductor 202 and second conductor 204 may have the opposite lay directions (i.e., first conductor 202 laying clockwise and second conductor 204 laying counter-clockwise). As will be described in greater detail below with regard to FIG. 4, each set of concentric circles may form a horizontal layer in multiple conductor container assembly 100.

Figure 3:
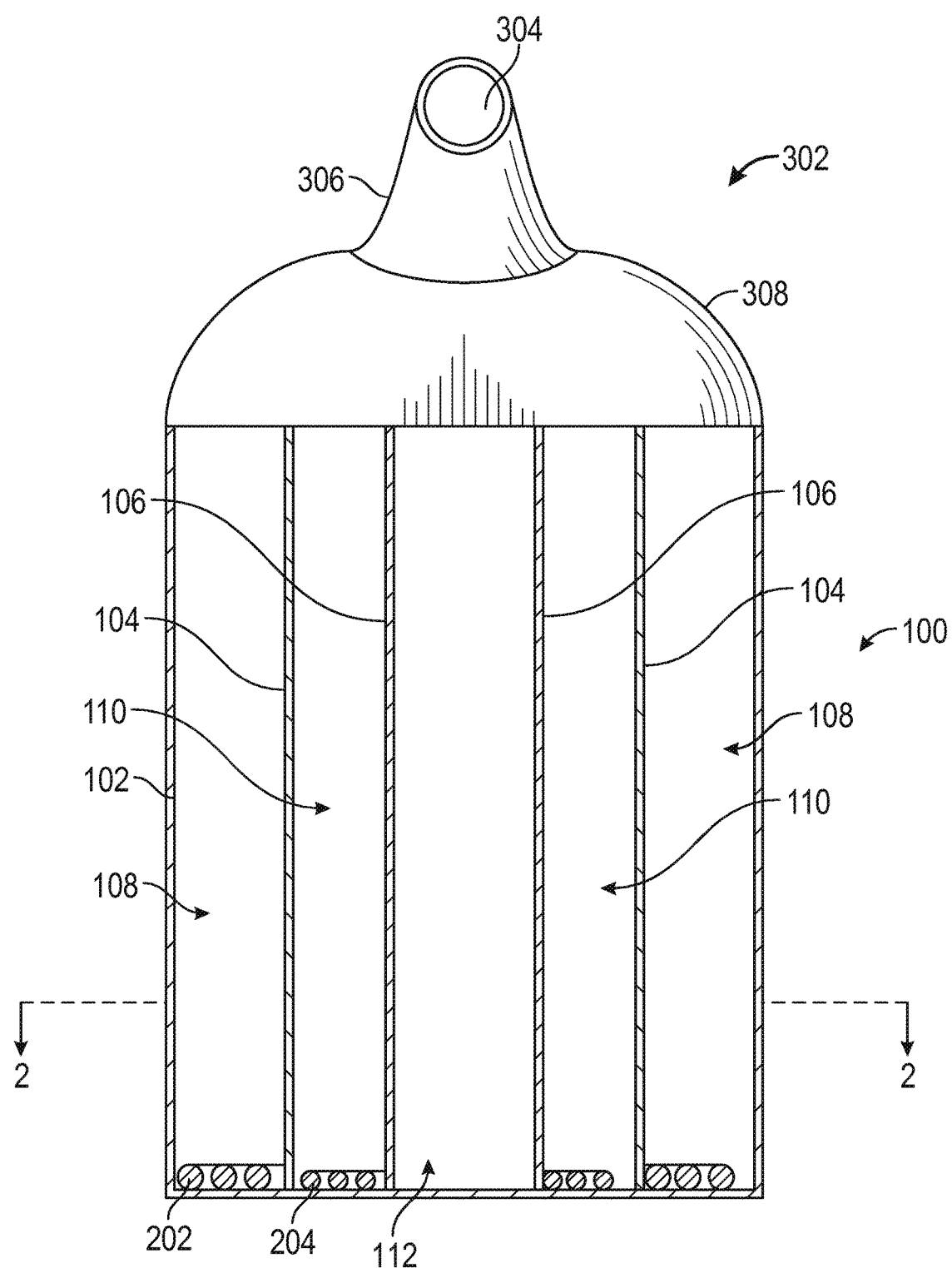
FIG. 3 shows a side view of the multiple conductor container assembly.

FIG. 3 shows a side view of multiple conductor container assembly 100. As shown in FIG. 3, multiple conductor container assembly 100 may include a container tap wire guide 302 that may facilitate removal of first conductor 202 and second conductor 204 from multiple conductor container assembly 100. Container tap wire guide 302 may comprise an opening 304 in at least one leg 306. The at least one leg 306 may be flexible, ridged, and adjustable. The at least one leg 306 may be fixed to a top 308 or may be rotatably connected to top 308. Top 308 may be fixed to or may be rotatably connected to multiple conductor container assembly 100. While FIG. 3 shows container tap wire guide 302 having a curved dome type structure, container tap wire guide 302 may be any shape such as a pyramid, a conical structure, etc. Opening 304 may allow first conductor 202 and/or second conductor 204 to exit multiple conductor container assembly 100. Container tap wire guide 302 may also include additional features not shown such as rollers, a twister and devices that may braid or bind first conductor 202 to second conductor 204.

Figure 4:
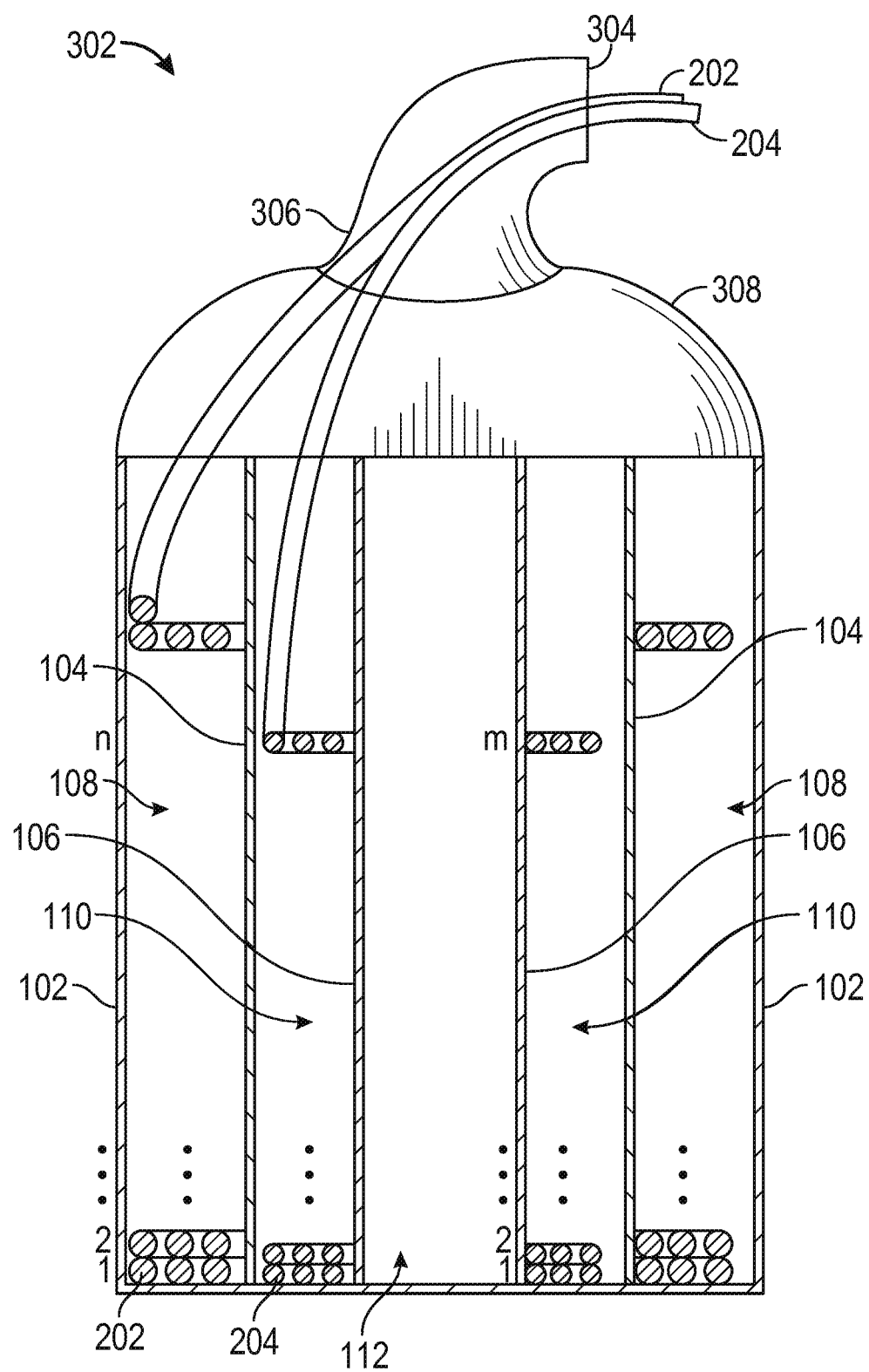
FIG. 4 shows cross-section of the multiple conductor container assembly.

FIG. 4 shows a cross-section of multiple conductor container assembly 100 along section line 3 shown in FIG. 2. FIG. 4 shows first conductor 202 forming layers 1 through n and second conductor 204 forming layers 1 through m. As shown in FIG. 4, first conductor 202 and second conductor 204 may have different diameters and therefore there may be more or less layers formed by second conductor 204 than by first conductor 202. During use, first conductor 202 and second conductor 204 may be pulled by a user through opening 304. First conductor 202 and second conductor 204 may both be fed from multiple conductor container assembly 100 through opening 304. Also, first conductor 202 may be fed from multiple conductor container assembly 100 through opening 304 independently from second conductor 204. In addition, while FIG. 4 shows first conductor 202 and second conductor 204 being fed into independent sections, first conductor 202 and second conductor 204 may be fed into the same section (e.g., first volume 108 or second volume 110). In other words, each volume may receive more than one conductor. Container tap wire guide 302 may have multiple openings for first conductor 202 and second conductor 204 separately.

Furthermore, while FIGS. 1 through 4 show multiple conductor container assembly 100 as being circular, embodiments may comprise other shapes. For example, multiple conductor container assembly 100 may be square, rectangular, spherical, or any other shape. For example, in various embodiments, outer wall 102 and middle wall 104 may be circular, and inner wall 106 may be rectangular. In addition, while FIGS. 1 through 4 show multiple conductor container assembly 100 having cavities of differing volumes, the cavities may have the same volume. Furthermore, first volume 108 may be sized to hold a first particular amount of a first conductor (e.g., 2,500 feet of 12 gauge wire) and second volume 110 may be sized to a second particular amount of a second conductor (e.g., 2,500 feet of a 18 gauge wire). The conductors housed in the different cavities may be of the same type. For instance, first volume 108 and second volume 110 may each house 5,000 feet of 12 gauge wire. Moreover, while FIGS. 1-4 show a single conductor housed in each cavity of multiple conductor container assembly 100, each cavity may house multiple conductors. For example, first volume 108 may house two parallel conductors (e.g., a 12 gauge black wire and a 12 gauge white wire) and second volume 110 may house a single conductor (e.g., a 12 gauge green wire).

Figure 5:
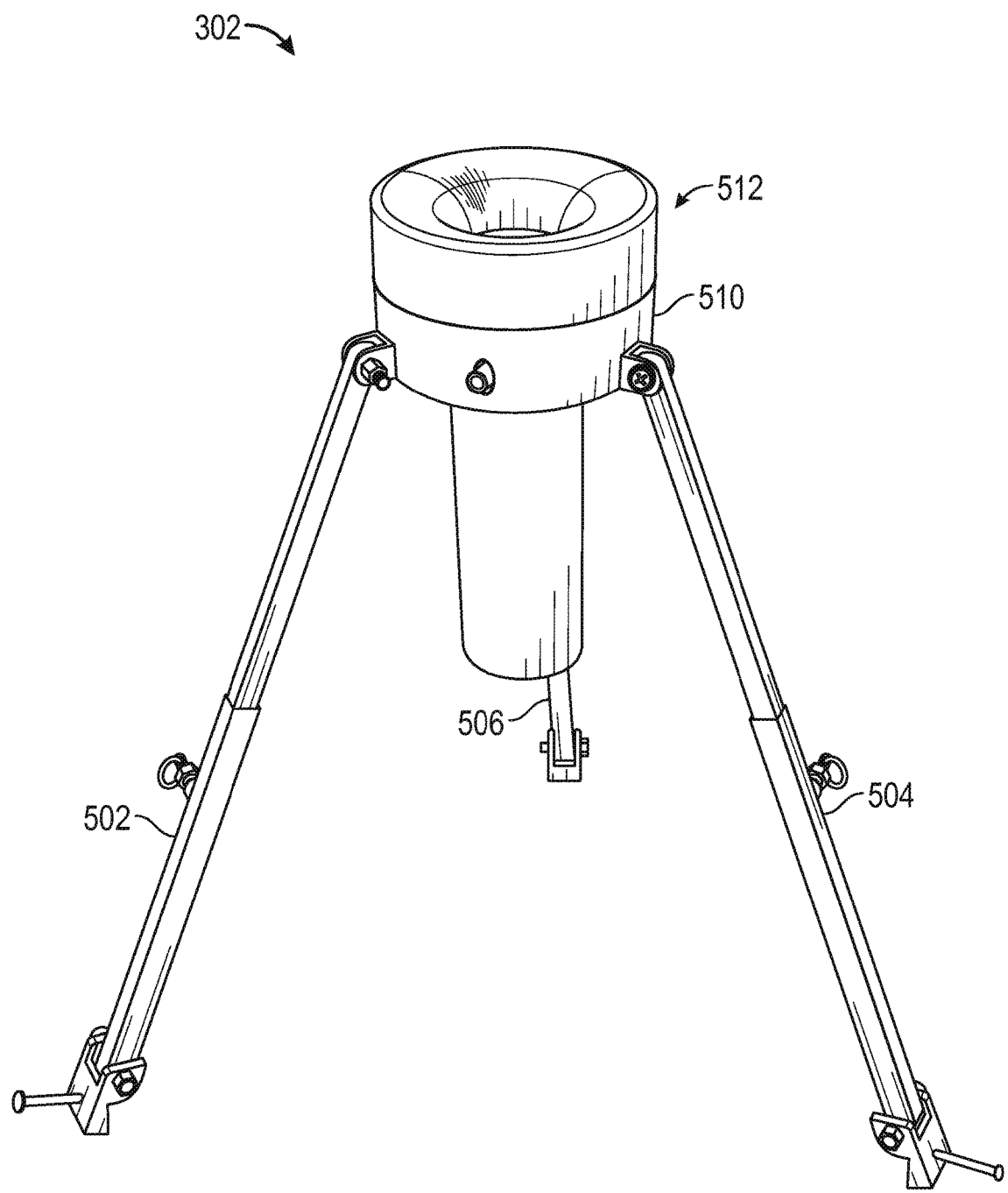
FIG. 5 shows a container tap wire guide.

FIG. 5 shows another embodiment of container tap wire guide 302. Container tap wire guide 302 may comprise a plurality of legs (e.g., a first leg 502, a second leg 504, and a third leg 506) that may be connected to a collar 510. Collar 510 may receive an insert 512. The connection points where the plurality of legs may connect to collar 510 may pivot. In addition, the plurality of legs may be adjustable in length. Furthermore, the plurality of legs may comprise clamps that may be used to connect container tap wire guide 302 to multiple conductor container assembly 100. Set screws may be used to secure insert 512 into collar 510.

Figure 6:
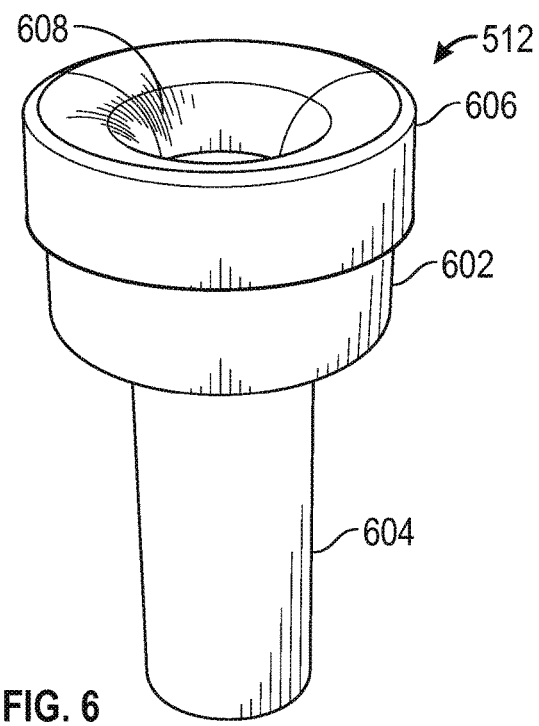
FIG. 6 shows an insert.

FIG. 6 shows insert 512 in more detail. Insert 512 may comprise a male portion 602 that may mate with collar 510. Insert 512 also may comprise a neck 604 and a top portion 606. Top portion 606 may include a shaped surface 608 that may provide conductors a smooth transition away from container tap wire guide 302 as it passes up through neck 604 and out of top portion 606. Shaped surface 608 may be curved, arc-shaped, parabolic, or any other shape that may provide a smooth transition. Shaped surface 608 may allow conductors to be pulled from multiple conductor container assembly 100 without damage to the conductors. Neck 604 may also include a shaped surface (not shown) exposed to conductors entering insert 512 through the bottom of neck 604. Neck 604's shaped surface may be shaped similarly to shaped surface 608 and may allow the conductors to enter insert 512 without damage. In addition, the shaped surfaces may allow the conductors to be pulled in any direction without damage.

Insert 512 may act to hinder the conductors from falling back into multiple conductor container assembly 100 when not being pulled by a user. For instance, the conductors may have a natural twist imparted upon them as they are pulled from multiple conductor container assembly 100. This natural twist may cause portions of the conductors to rest against the inner surface of neck 604. The friction between the conductors and the inner surface may hinder the conductors from falling back into multiple conductor container assembly 100. Insert 512 may also include a lubricant applying member (not show) that may apply a lubricant to the conductors as they pass through insert 512.

Figure 7:
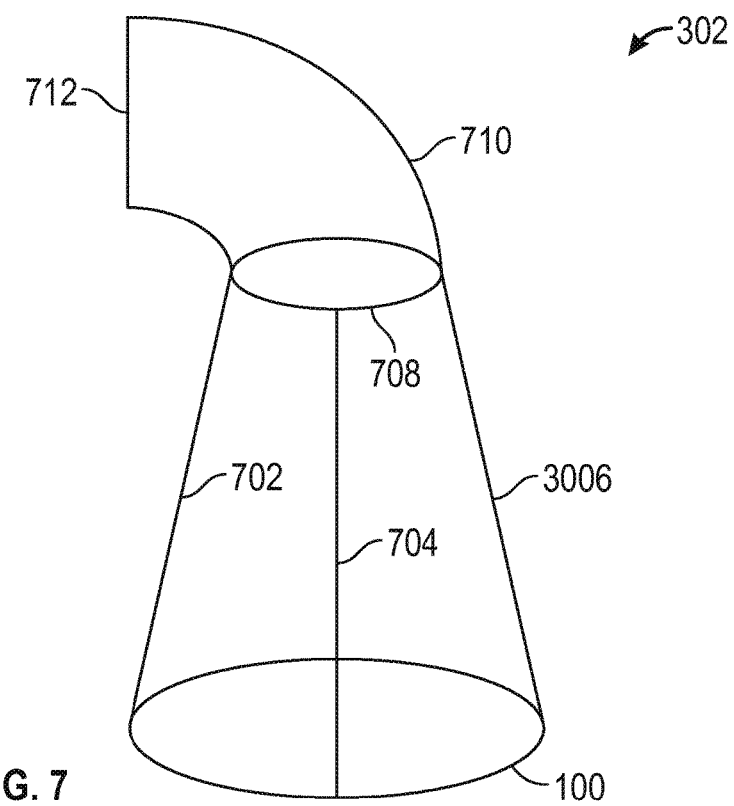
FIG. 7 shows a container tap wire guide.

FIG. 7 shows yet another embodiment of container tap wire guide 302 that may be attached to the top of multiple conductor container assembly 100. Container tap wire guide 302 may comprise a plurality of legs (e.g., a first leg 702, a second leg 704, and a third leg 706) and a feeder ring 708. Conductors from each of cavities multiple conductor container assembly 100 may be pulled together a through feeder ring 708. Feeder ring 708 may be manufactured such that portions that may contact the conductors do not rub against a sharp edge. In addition, feeder ring 708 may be configured to apply a lubricant to wires or cable being pulled through it. Container tap wire guide 302 may be permanently attached or removable.

Container tap wire guide 302 may include a cap structure 710 that may facilitate removal of conductors from multiple conductor container assembly 100. Cap structure 710 may comprise an opening 712. Cap structure 710 may be flexible or may be ridged. Cap structure 710 may be fixed or may be rotatably connected to multiple conductor container assembly 100. While FIG. 7 shows cap structure 710 having a curved structure, cap structure 710 may be any shape such as a pyramid, a conical structure, etc. Cap structure 710 may also include additional features not shown such as a twister and devices that may braid or bind conductors together.

Container tap wire guide 302 may comprise a locking mechanism (not shown) that may comprise a choking member located internal or external to container tap wire guide 302, cap structure 710, or opening 712. The choking member may hinder wires or cables from traveling back into multiple conductor container assembly 100. For instance, during operation an electrician may pull wires or cables through cap structure 710. The choking member may then prevent the wires and cables from slipping back into multiple conductor container assembly 100. This may prevent the electrician from having to feed the wires and cables though container tap wire guide 302 every time he cuts the conductors.

Conductors used in conjunction with multiple conductor container assembly 100, insert 512, and/or cap structure 710 may also comprise a cable having a jacket having a built-in lubricant (e.g., SIMPULL® cable) to lower the pulling force need to pull the wires or cables past surfaces they may contact.

Figure 8:
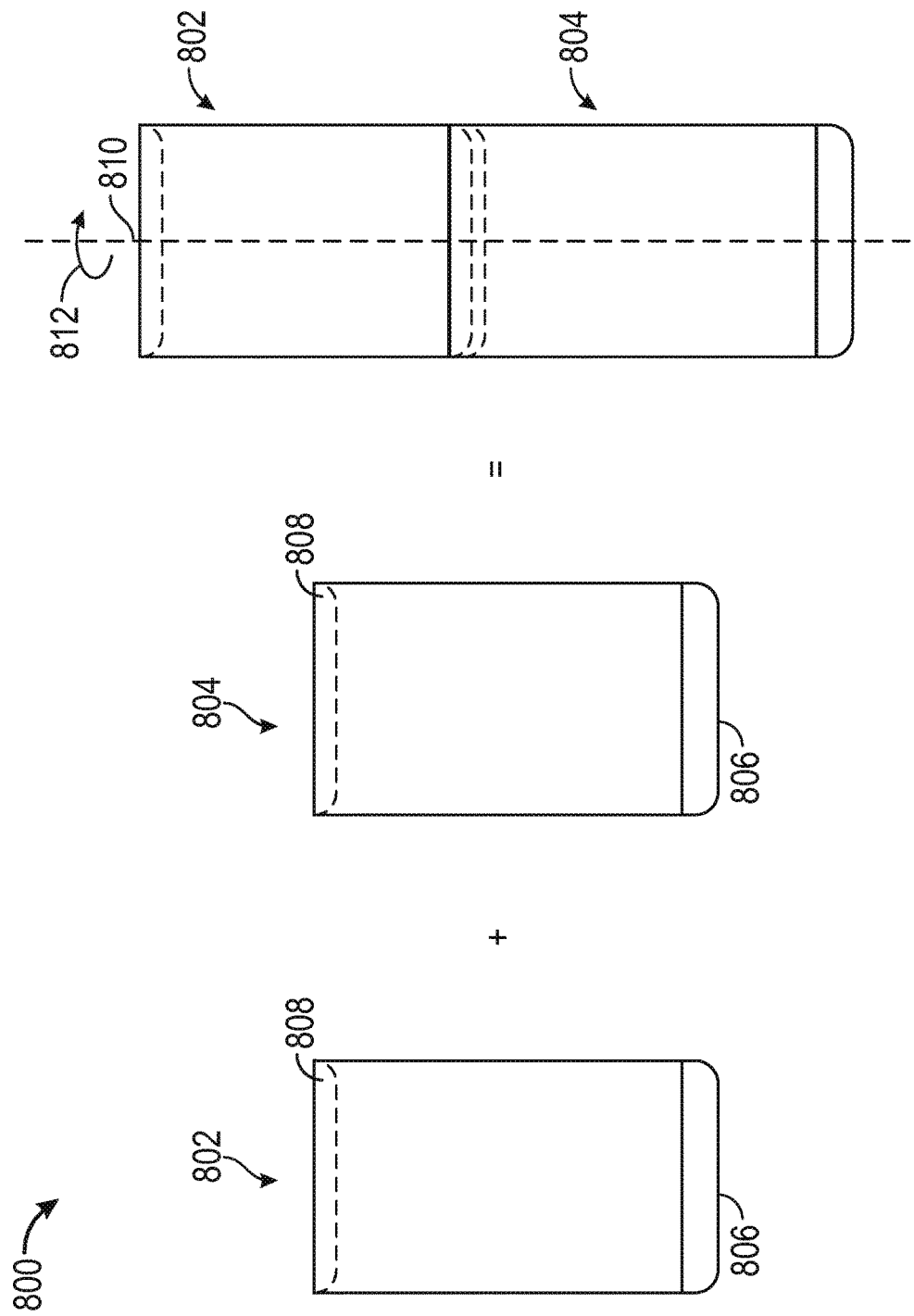
FIG. 8 shows a method and configuration for stacking multiple conductor container assemblies.

FIG. 8 shows a method 800 and configuration that may allow a multiple conductor container assembly 802 to be stacked on top of another multiple conductor container assembly 804. As show in FIG. 8, multiple conductor container assembly 802 and multiple conductor container assembly 804 may include complementary surfaces to facilitate stacking. For example, a male surface 806 and a female surface 808. During stacking, male surface 806 may mate with female surface 808 to create an interlocking effect that may help hinder the multiple conductor container assembly 802 from sliding off the multiple conductor container assembly 804. When multiple conductor container assembly 802 is located atop multiple conductor container assembly 804, the weight of multiple conductor container assembly 802, coupled with the interaction between male surface 806 and female surface 808, may keep multiple conductor container assembly 802 from sliding off the top of multiple conductor container assembly 804.

In addition, male surface 806 and female surface 808 may include locking members that may create an interlocking connection. For example, male surface 806 may include tenons (not shown) that fit within mortises (not shown) located in female surface 808. Upon the tenons being inserted into the mortise, multiple conductor container assembly 802 may be rotated about an axis 810 as indicated by arrow 812. This rotation may lock the multiple conductor container assembly 802 to multiple conductor container assembly 804.

Figure 9:
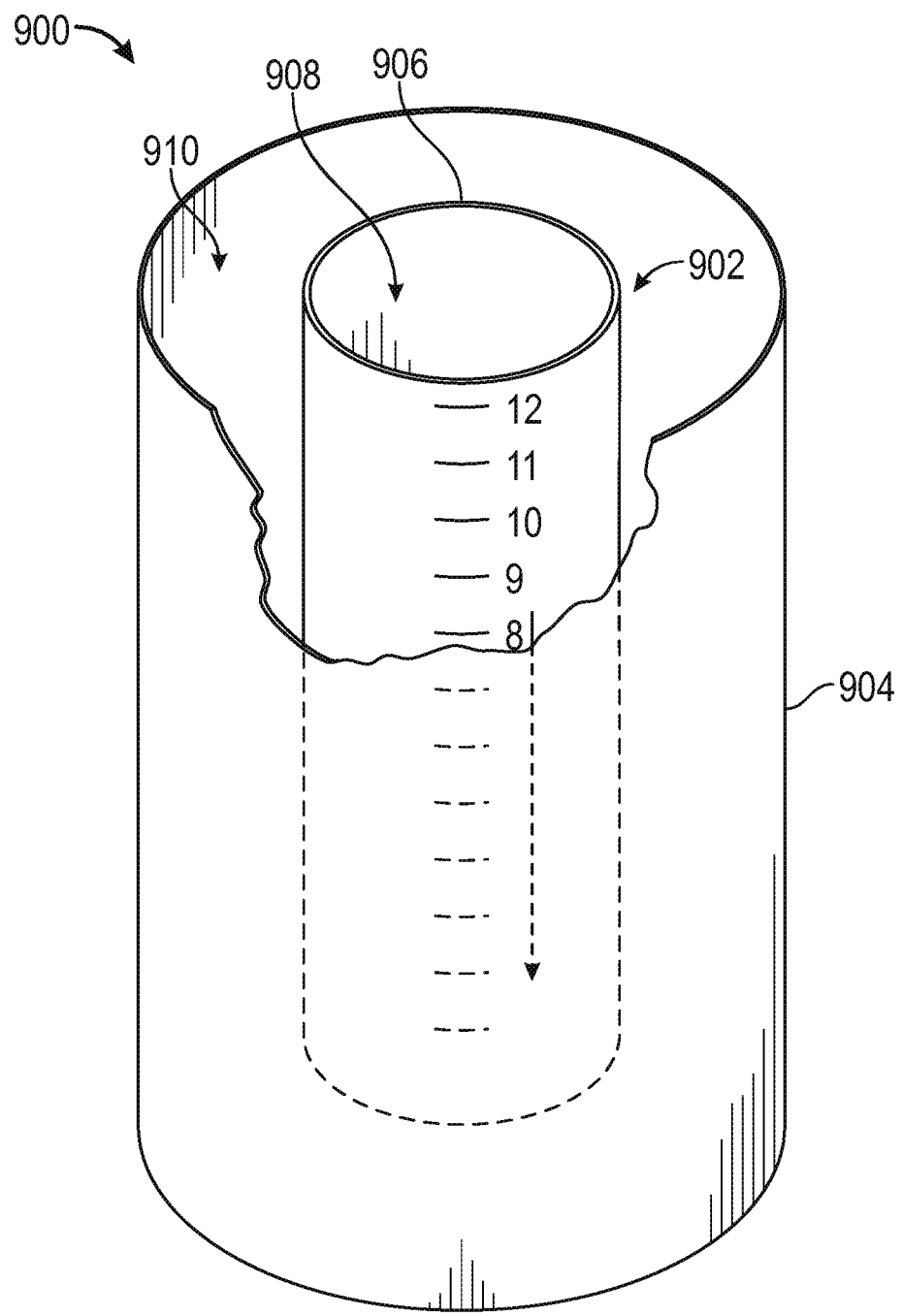
FIG. 9 shows a multiple conductor container having graduations.

FIG. 9 shows a multiple conductor container 900 comprising graduations 902. Multiple conductor container 900 may comprise an outer container 904 and an inner container 906. Inner container 906 may have an outer surface 908. Graduations 902 may be located on outer surface 908. In addition, outer container 904 may have an inner surface 910. Graduations 902 may be located on inner surface 910. The graduations may be placed on an external surface such as a yardstick.

During manufacturing, graduations 902 may be printed directly on inner surface 910 or outer surface 908. Embodiments may also include graduations 902 being printed on a sticker or other label (not shown) and applied to inner surface 910 or outer surface 908. Further embodiments may comprise multiple conductor container 900 being comprised of a transparent portion, or be manufactured entirely out of a transparent material, that may allow a user to view an amount of conductors located in multiple conductor container 900.

Figure 10:
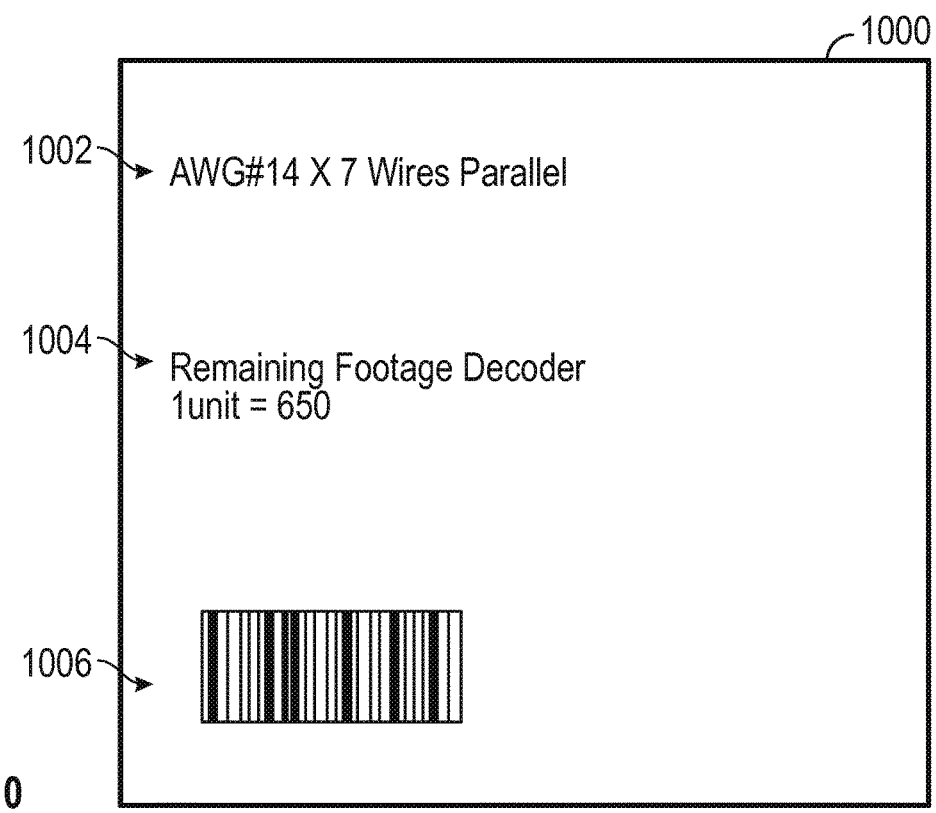
FIG. 10 shows a label for a conductor container.

FIG. 10 shows a label 1000 that may be attached to multiple conductor container 900. Label 1000 may include a designation 1002. Designation 1002 may include text describing the type of cable in multiple conductor container 900. For instance, designation 1002, as shown in FIG. 10, may indicate that a cable stored in multiple conductor container 900 may comprise seven 14 gauge conductors in parallel. Other information that may be included on label 1000 includes the number of conductors within multiple conductor container 900 and the amount of each contained in multiple conductor container 900. For instance, multiple conductor container 900 may contain 1,000 feet of a AWG#14 white wire and 1,500 feet of a AWG#18 green wire.

Label 1000 may also include a scale 1004. Scale 1004 may provide a user with information to estimate a remaining amount of cable in multiple conductor container 900. For instance, scale 1004, as shown in FIG. 10, may indicated that for every one unit of graduation in graduations 902 there may be 650 feet of the seven 14 gauge conductors. For example, graduations 902, as shown in FIG. 9, include 12 units, so multiple conductor container 900, when full, may contain 7,800 feet of cable (650 feet/unit×12 units). During use an electrician may estimate he needs 3,500 feet of cable for a particular job. To determine if multiple conductor container 900 contains enough cable for the particular job, he may use label 1000 in conjunction with graduations 902 to determine that if multiple conductor container 900 contains less than 6 units (3,500 feet/650 ft/unit=5.38 units of conductors), he may not have enough cable for the particular job.

Graduations 902 may be conductor specific or standard sizes. For example, multiple conductor container 900 may be manufactured with graduations 902 spaced for a particular cable (e.g., a 14 gauge wire). Embodiments may also include using label 1000 to allow for multiple conductor container 900 to be manufactured with standard graduations. For instance, multiple conductor container 900 may be a standard container size that may be able to accept multiple types of conductor ranging from very small gauges to very large gauges and from a single conductor to multiple conductors of varying gauges. Having a standard container with standard graduations may make the manufacturing of multiple conductor container 900 more efficient than manufacturing containers having different graduations for different conductor sizes.

Label 1000 may also include other information. For instance, an estimated weight of multiple conductor container 900 may be included on label 1000. For example, label 1000 may indicate that each unit of graduation is approximately 100 pounds of cable. Thus, when multiple conductor container 900 is full of conductor (i.e., has 12 units of conductor) it may weigh approximately 1,200 lbs. This information may be useful when estimating shipping weights. Other information that may be included on label 1000 may include, for example, a lot number, model number, serial number, manufacturing date, and manufacturing location. In addition, label 1000 may include a barcode 1006 that may allow a user to determine information about the contents of multiple conductor container 900.

Figure 11:
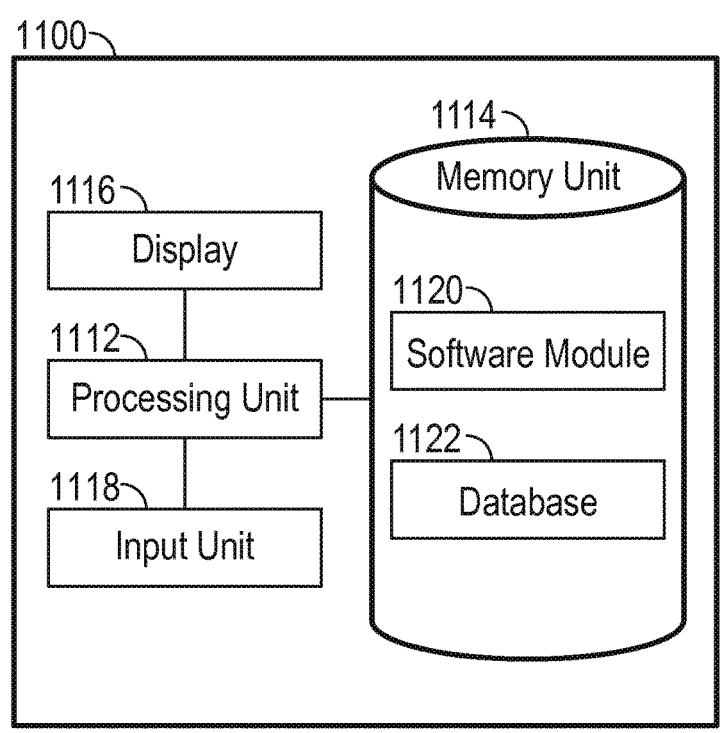
FIG. 11 shows a computer.

Furthermore, an application running on a computer 1100, shown in FIG. 11, (e.g., a smartphone) may receive information that allows the computer calculate an amount of wire remaining in multiple conductor container 900. As shown in FIG. 11, computer 1100 may include a processing unit 1112, a memory unit 1114, a display 1116, and an input unit 1118. Memory unit 1114 may include a software module 1120 and a database 1122. While executing on processing unit 1112, software module 1120 may perform processes for determining an amount of conductor remaining in multiple conductor container 900, including, for example, one or more stages included in method 1200 described below with respect to FIG. 12.

Computer 1100 ("the processor") may be implemented using a personal computer, a network computer, a mainframe, a smartphone, or other similar computer-based system. Computer 1100 may also be configured to transmit data to a supplier or manufacturer. For instance, if there is a problem with the wire in multiple conductor container 900 a user, using computer 1100, may scan barcode 1006 located on label 1000 and transit the information to the supplier of manufacturer of multiple conductor container 900.

The processor may comprise any computer operating environment, such as hand-held devices, multiprocessor systems, microprocessor-based or programmable sender electronic devices, minicomputers, mainframe computers, and the like. The processor may also be practiced in distributed computing environments where tasks are performed by remote processing devices. Furthermore, the processor may comprise a mobile terminal, such as a smart phone, a cellular telephone, a cellular telephone utilizing wireless application protocol (WAP), personal digital assistant (PDA), intelligent pager, portable computer, a hand held computer, or a wireless fidelity (Wi-Fi) access point. The aforementioned systems and devices are examples and the processor may comprise other systems or devices.

Figure 12:
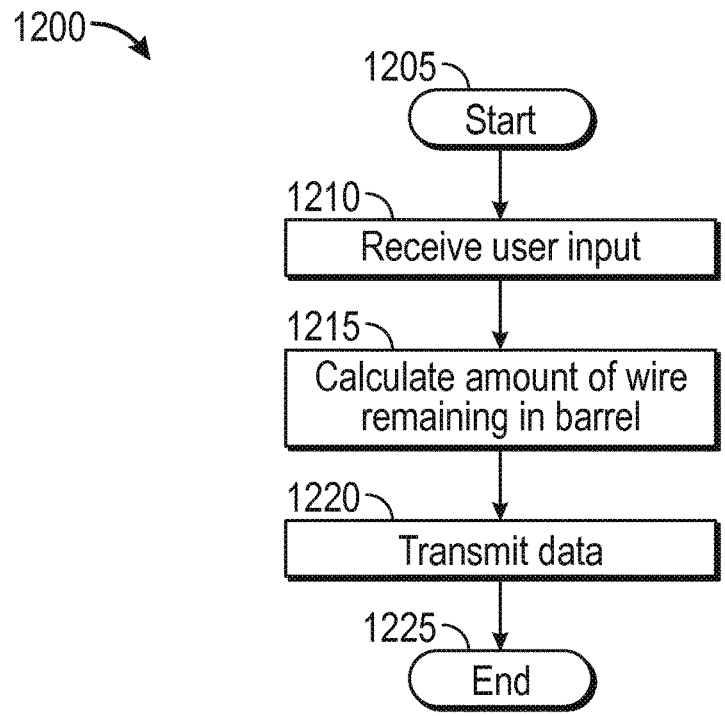
FIG. 12 shows a flowchart of a method for estimating a remaining amount of wire in a multiple conductor container.

FIG. 12 is a flow chart setting forth the general stages involved in method 1200 for determining an amount of wire remaining in multiple conductor container 900. Method 1200 may be implemented using, for example, computer 1100 as described in more detail above. Ways to implement the stages of method 1200 will be described in greater detail below.

Method 1200 may begin at starting block 1205 and proceed to stage 1210 where computer 1100 may receive input. For example, after using some of the conductor in multiple conductor container 900, an electrician may input information into computer 1100. For instance, the electrician may input the graduation displayed on label 1000 and other information such as wire size, container size, etc. Some of the inputs may be received by computer 1100 reading barcode 1006 on label 1000. In other words, the electrician may read and input the graduation reading into computer 1100. The electrician may cause computer 1100 to read barcode 1006 to gather any other information needed to calculate the amount of wire remaining in multiple conductor container 900. As an alternative or in addition to the graduation reading, the electrician may enter a weight of multiple conductor container 900 or a total resistance of the wire remaining in multiple conductor container 900.

From stage 1210, where computer 1100 received the input, method 1200 may advance to stage 1215 where computer 1100 may calculate an amount of conductor remaining in multiple conductor container 900. For example, computer 1100 may use a formula stored in memory unit 1114 to calculate the remaining amount of wire. Barcode 1006, for example, may provide computer 1100 with information needed to retrieve information about multiple conductor container 900 and/or about the contents of multiple conductor container 900 from a manufacturer via the internet, for example. After reading barcode 1006, computer 1100 may obtain a calibration scale for graduations 902. In addition, barcode 1006 may allow computer 1100 to retrieve information that may be combined with other data from the electrician to determine an amount of conductor in multiple conductor container 900. For example, after reading barcode 1006, the electrician may input a property such as, for example, the weight of multiple conductor container 900 or the overall resistance of the conductor remaining in multiple conductor container 900. For this information, computer 1100 may calculate the amount of conductor remaining in multiple conductor container 900.

From stage 1215, where computer 1100 calculates the remaining amount of wire in multiple conductor container 900, method 1200 may advance to stage 1220 where computer 1100 may display the remaining amount of wire in multiple conductor container 900. In addition, computer 1100 may transmit the remaining amount of wire in multiple conductor container 900 to a supplier, manufacturer, or other entity. For example, computer 1100 may transmit the remaining amount of conductor to a supplier notifying the supplier that the electrician may need more wire. In addition, if there is some defect with multiple conductor container 900 or the conductor located therein, the supplier or manufacturer may be notified and the electrician given a credit, discount, or other monetary compensation. From stage 1220, where computer 1100 may transmit data, method 1200 may end at stage 1225.

Figure 13:
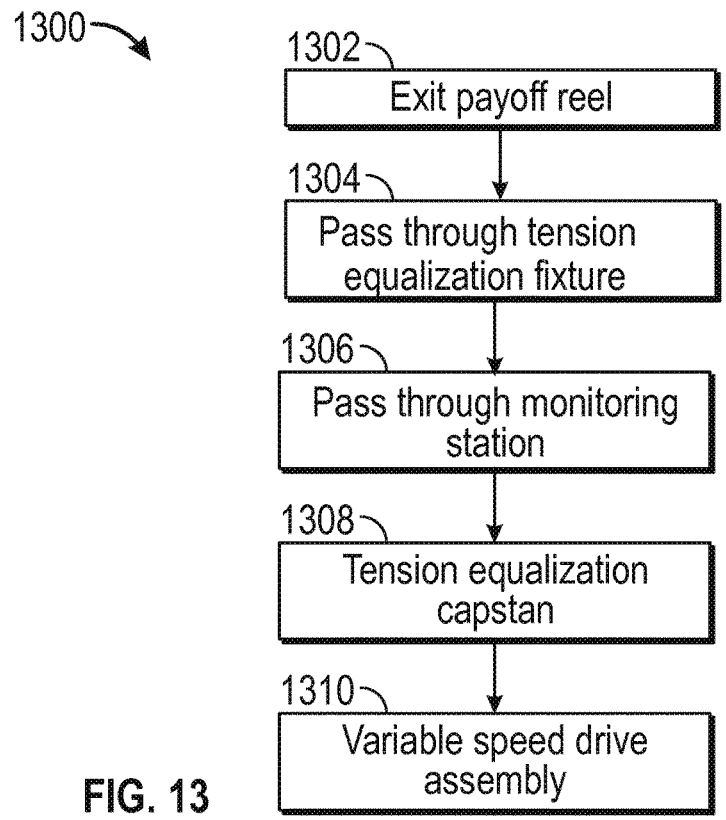
FIG. 13 shows a flow chart of a method for packaging multiple conductors.

FIG. 13 shows a flow chart for a process 1300 for packaging multiple conductors. First, in stage 1302, the multiple conductors may be fed from a payoff reel. The payoff reel may be part of a production line. For example, as the multiple conductors are being manufactured they may be fed to a take-up reel. After the multiple conductors are manufactured, the take-up reel may be stored for use in process 1300 either immediately or at a later day. The take-up reel may be any container suitable for storing the multiple conductors. For example, the multiple conducts may be stored in stems, barrel, reels, or as coils.

Figure 14:
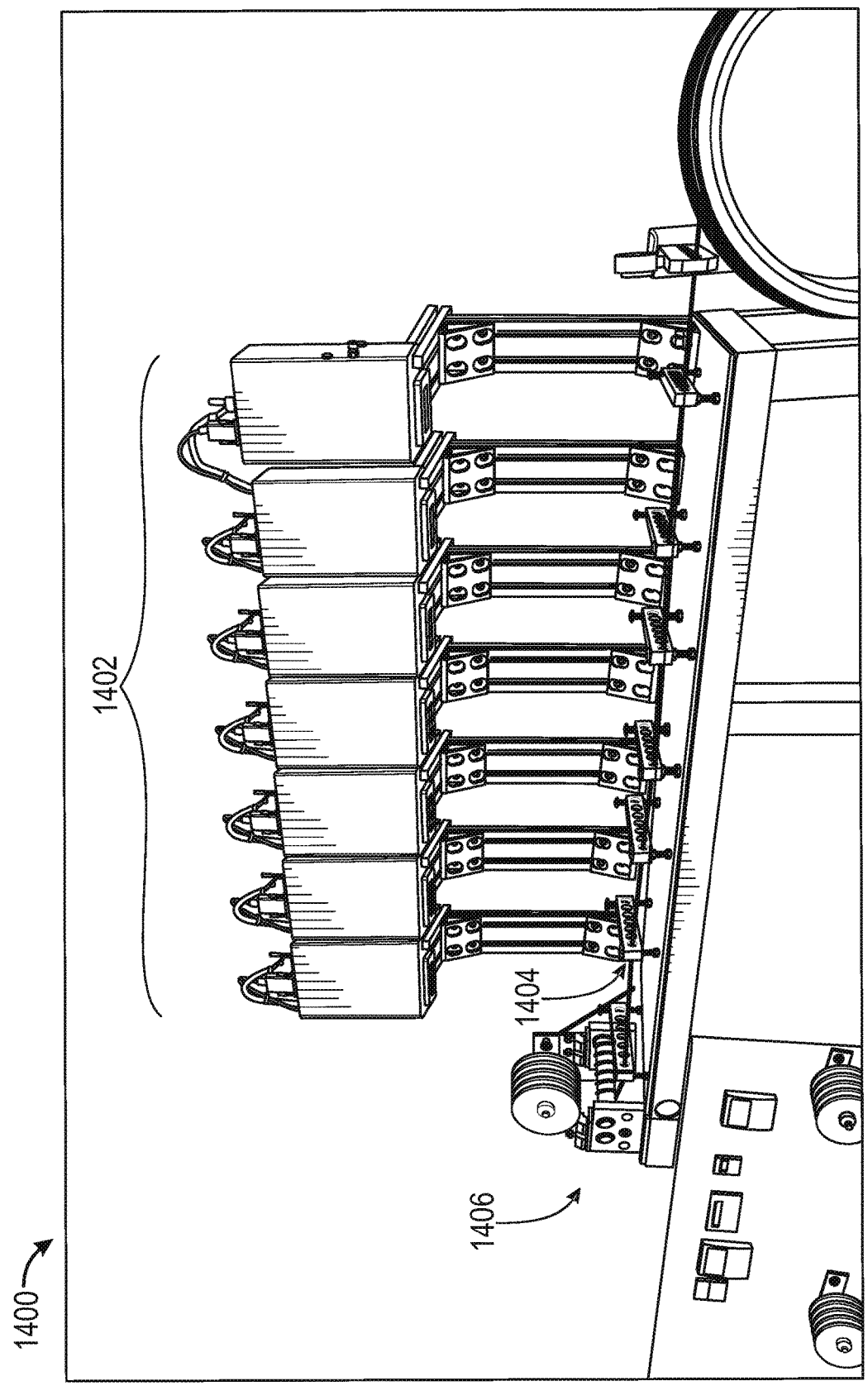
FIG. 14 shows a monitoring station.

After the multiple conductors are manufactured and fed to the take-up reel, process 1300 may proceed to stage 1304 where the multiple conductors may pass through a tension equalization fixture (shown in FIG. 14). The tension equalization fixture may comprise a wire straightener 1406 (shown in FIG. 14). The wire straightener may help remove memory or twist in the wire that may have developed while feeding the multiple conductors from a payoff reel or a production line. For example, wire straightener 1406 may comprise a set of rollers that the multiple conductors may pass through. The height of the rollers may be adjusted to increase or decrease the pressure on the conductors. The increase or decrease in pressure may act to further straighten the wires.

After the multiple conductors pass through the tension equalization fixture, process 1300 may proceed to stage 1306 where the multiple conductors may pass through a monitoring station 1400, shown in FIG. 14. Monitoring station 1400 may comprise a plurality of optical sensors 1402. Plurality of optical sensors 1402 may utilize lasers and a Doppler Effect to measure a speed the conductors travel. In addition, the plurality of optical sensors 1402 may measure a length of the conductors. For example, the conductors may travel through a guide 1404 (shown in greater detail in FIG. 15).

Figure 15:
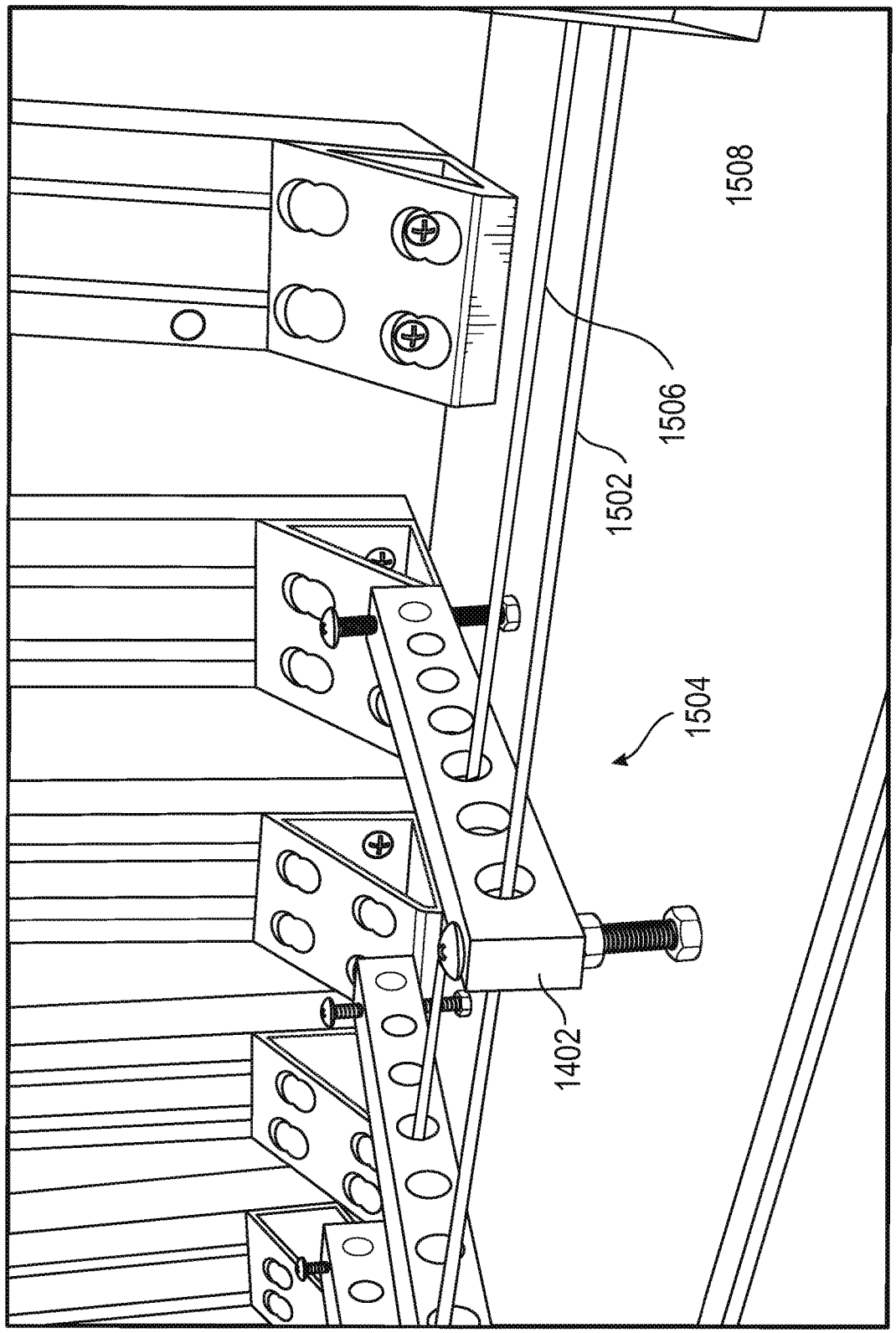
FIG. 15 shows a guide.

Monitoring station 1400 may allow a user to detect problems with laying the multiple conductors in multiple conductor container assembly 100. For example, as shown in FIG. 15, a first conductor 1502 and a second conductor 1506 may pass through one of a plurality of guide holes 1504 located in guide 1404. Monitoring station 1400 may monitor the length of each of the conductors being fed into multiple conductor container assembly 100. If the length or amount of each conductor being fed into multiple conductor container assembly 100 varies by a preset margin, process 1300 may terminate or an operator may be notified. After process 1300 terminates or the operator is notified, corrective measures may be taken. The preset margin may be measured as a percentage of total feet or a percentage of feet for a given feed rate. For example, first conductor 1502 may feed at a faster rate than second conductor 1506. To ensure that roughly the same amount of first conductor 1502 and second conductor 1506 are laid in multiple conductor container assembly 100, may alert the operator when the difference between the amount of first conductor 1502 and second conductor 1506 exceeds a certain amount.

Figure 16:
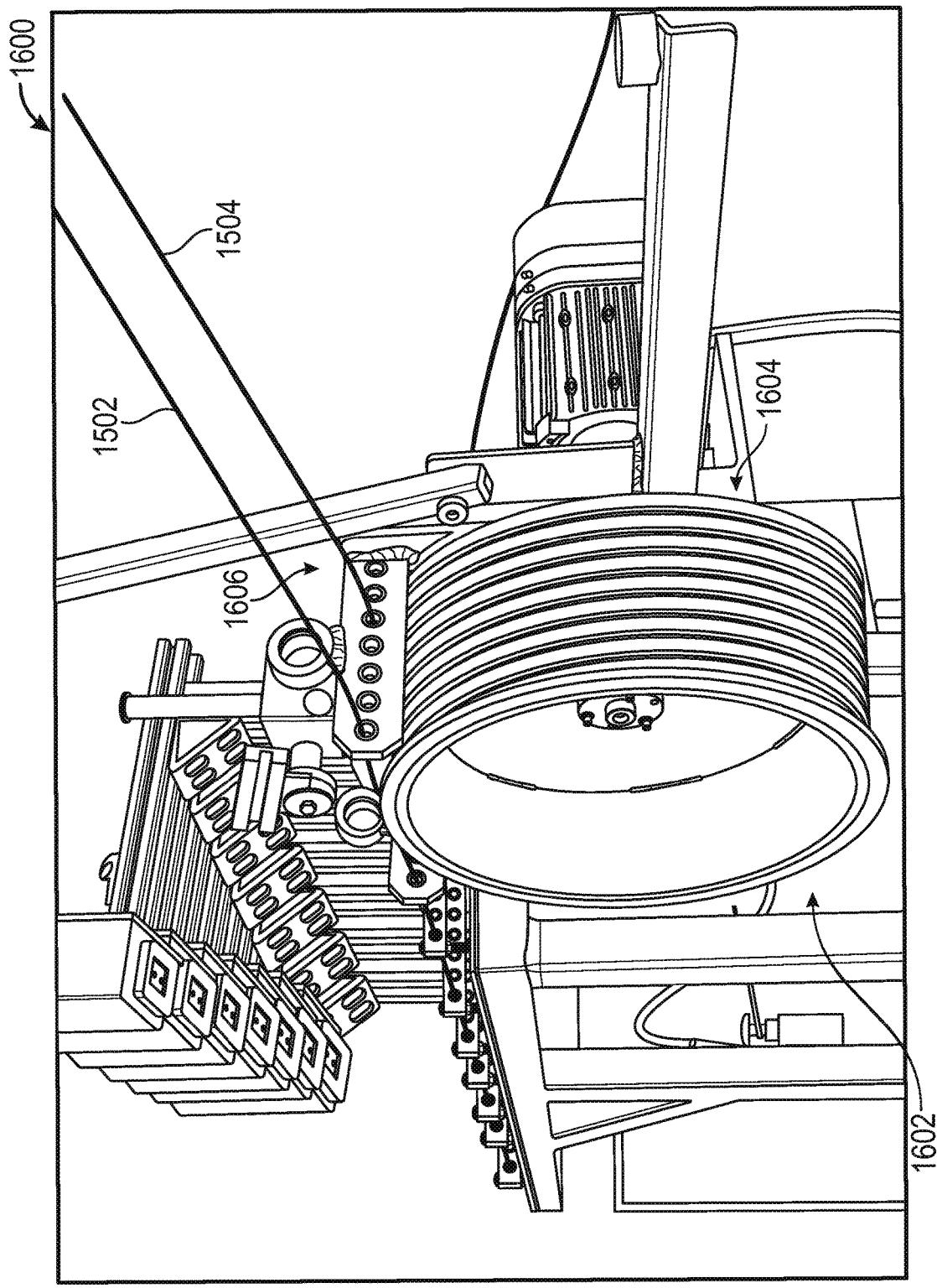
FIG. 16 shows a tension equalization capstan.

After the multiple conductors pass through monitoring station 1400, process 1300 may proceed to stage 1308 where the multiple conductors may be fed from monitoring station 1400 to a tension equalization capstan 1600 (shown in FIG. 16). Tension equalization capstan 1600 may assist the conductors to flow smoothly. Tension equalization capstan 1600 may pull the conductors from the payoff reel through monitoring station 1400. Tension equalization capstan 1600 may assist in minimizing and/or eliminating variables such as wire bends, issues with stiff wires, and tangles.

Tension equalization capstan 1600 may be a motor driven drum that may rotate at a constant speed. In addition, tension equalization capstan 1600 may comprise multiple motor driven drums. For example, each conductor may have its own motor driven drum that may operation at differing speeds than other motor driven drums. Tension equalization capstan 1600 may rotate at the constant speed regardless of a speed other capstans. The speed at which tension equalization capstan 1600 rotates may be set higher than a highest speed the multiple conductors may be fed at. The highest speed may be the actual speed the multiple conductors are fed to multiple conductor container assembly 100 or it may be an anticipated highest speed.

During operation, the multiple conductors may be in a loosely or tightly wrapped around drum 1602. For example, if the multiple conductors are being pulled, they may be wrapped around drum 1602 tighter than if they were not being pulled. Drum 1602 may be rotating in the direction the multiple cables are traveling. If there is no tension on the multiple conductors, drum 1602 may rotate without moving the multiple conductors moving. This rotation without the multiple conductors moving may facilitate a smooth flow of wire between the tension equalization capstan and multiple conductor container assembly 100.

Drum 1602 may have a finely machined finish. The finely machined finish may be located on the exterior of drum 1602 where the multiple conductors contact the drum 1602. The finely machined finish may allow the drum to rotate freely when no or little tension is on the multiple conductors. The finely machined finish may also allow the drum to feed the multiple conductors. As shown in FIG. 16, drum 1602 may also comprise a plurality of groves 1604. Groves 1604 may assist in keeping the multiple conductors from becoming tangled or crossing one another.

Tension equalization capstan 1600 may also comprise a guide 1606, which may be similar to guide 1404 shown in FIG. 15, having a plurality of holes. Each hole may receive one of the multiple conductors. Guide 1606 may assist in keeping the multiple conductors separate and may help hinder the multiple conductors from drifting and becoming tangled.

Figure 17A:
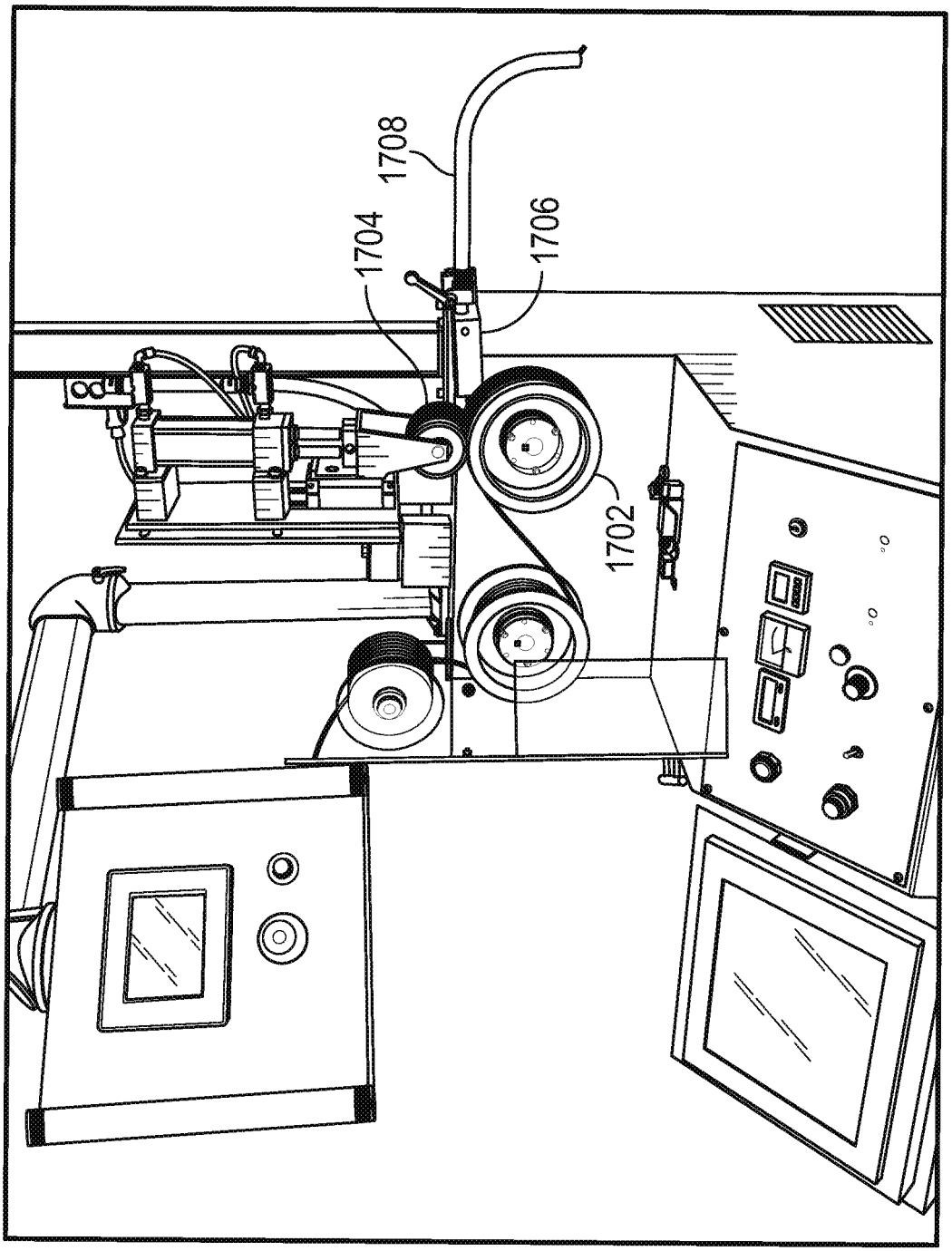
FIGS. 17A and 17B show a variable speed drive system.
Figure 17B:
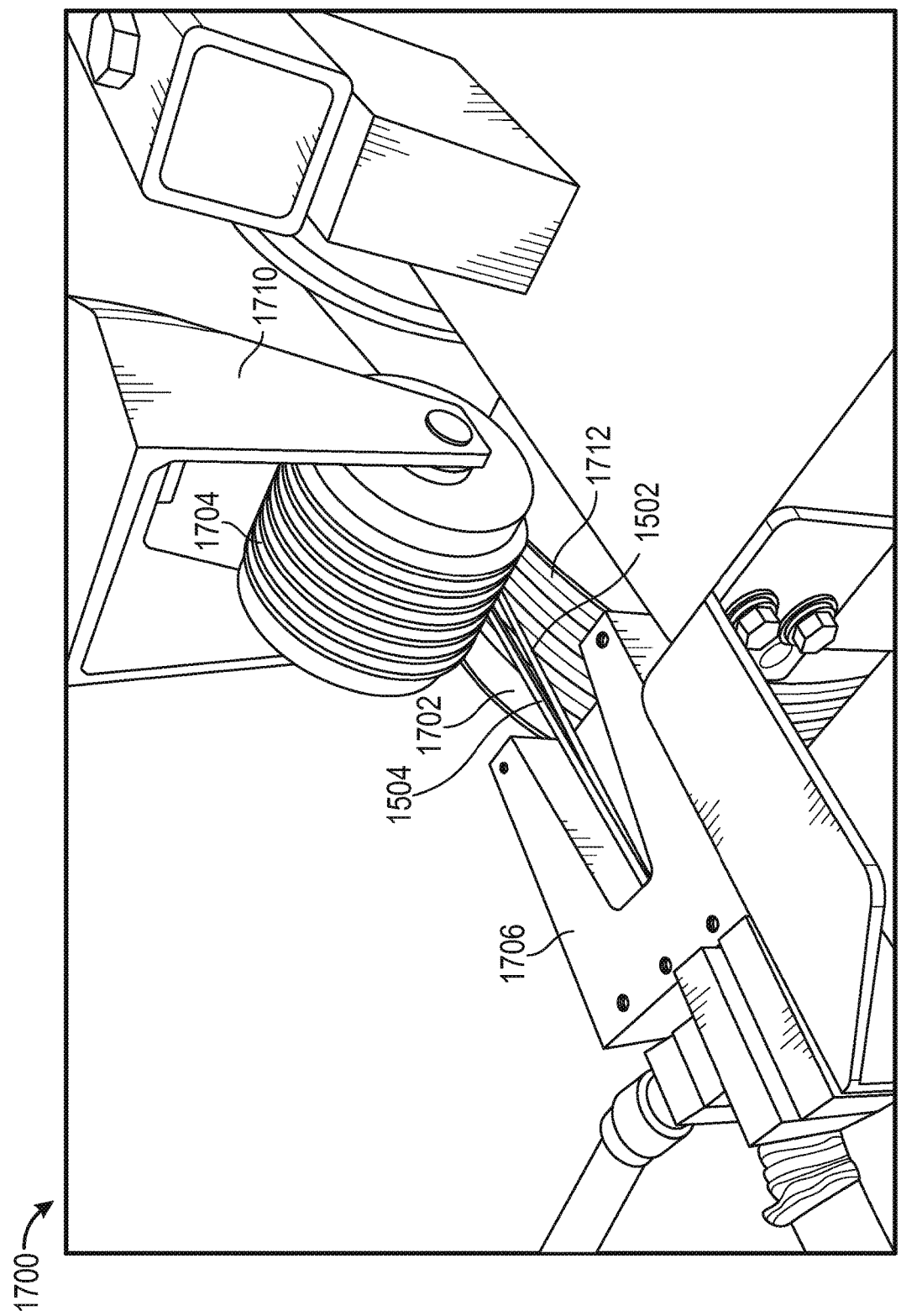

From stage 1308 where the multiple conductors may be fed to tension equalization capstan 1600, process 1300 may proceed to stage 1310 where a variable speed drive system 1700 (shown in FIGS. 17A and 17B) may package the multiple conductors.

During process 1300, each of the multiple conductors may be fed from tension equalization capstan 1600 to variable speed drive system 1700. Variable speed drive system 1700 may comprise a drive wheel 1702, a pressure roller 1704, a feed channel 1706, and a feed tube 1708. During operation, the multiple conductors may be fed through drive wheel 1702 and pressure roller 1704. The rotation drive wheel 1702 may pull the multiple conductors and cause them to tighten around drum 1602 and may cause the multiple conductors to move in unison. The pressure applied by pressure roller 1704 to drive wheel 1702 may assist drive wheel 1702 in gripping the multiple conductors. For example, if the multiple conductors have lubricated insulation, pressure may be applied via pressure roller 1704 to increase the friction between drive wheel 1702 and the lubricated insulation. This increased friction may assist in minimizing slippage between drive wheel and the multiple conductors.

Pressure roller 1704 may apply pressure via a hydraulic, pneumatic, or electric actuator. Pressure roller 1704 may comprise grooves or protrusions (1710 in FIG. 17B) that may mate with corresponding protrusion or grooves (1712 in FIG. 17B) in drive wheel 1702 to assist in increasing a contact surface area. The increased contact surface area may assist in minimizing slippage when a lubricated wire is used.

The multiple conductors may exit drive wheel 1702 and enter feed channel 1706. From feed channel 1706, the multiple conductors may enter feed tube 1708 where they may feed into multiple conductor container assembly 100. Feed channel 1706 may assist in orienting the multiple conductors. The orientation may allow the multiple conductors to be laid in a manner such that any memory or twist in the multiple conductors may enter multiple conductor container assembly 100 in coincide with one another. In other words the feed channel 1706 may cause the multiple conductors to have a singular memory. A singular memory may comprise any memory or twist in each of the conductors coinciding with any memory or twist of other conductors.

Figure 17C:
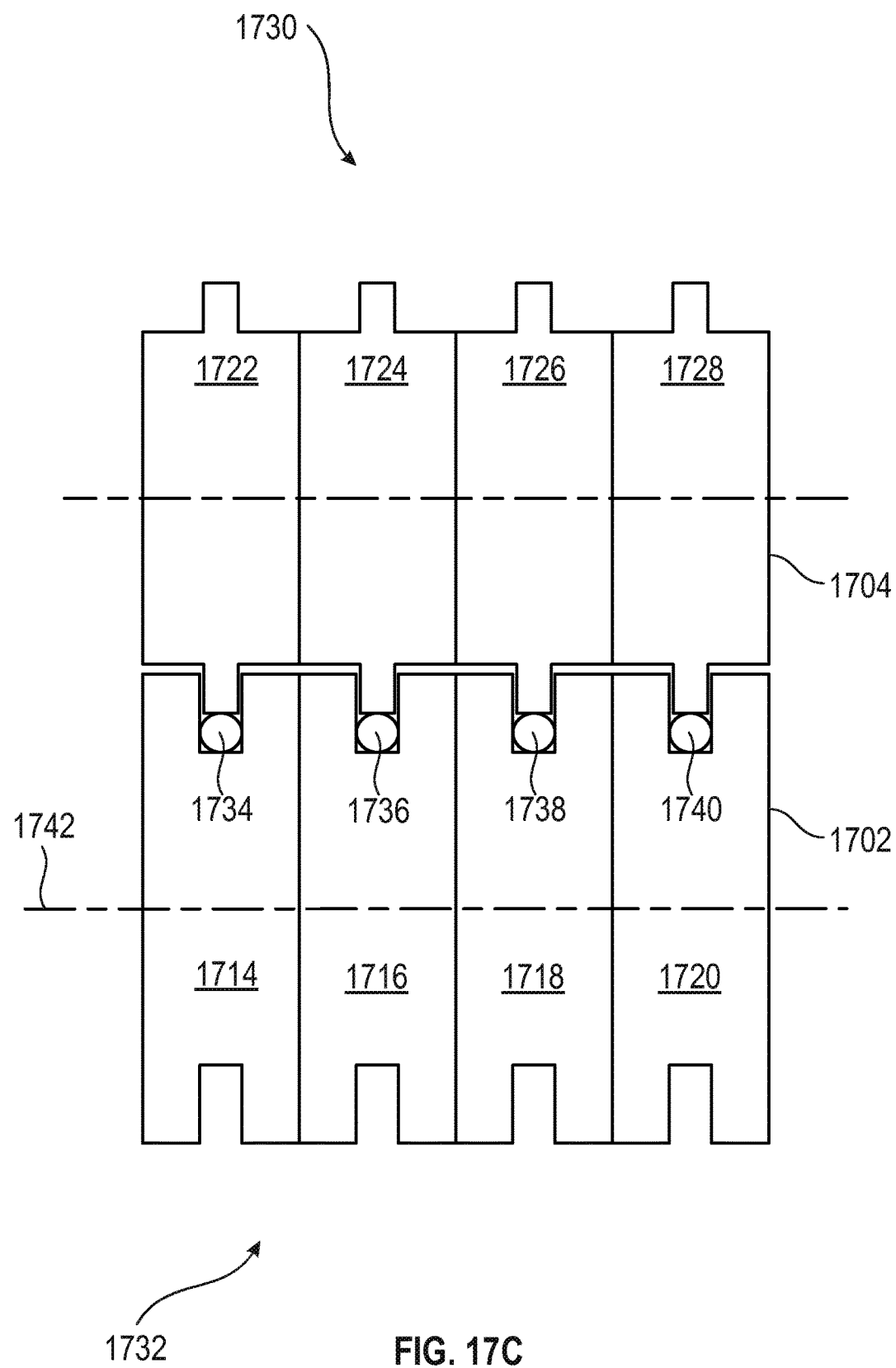
FIGS. 17C and 17D show a drive wheel and a pressure roller.

FIG. 17C shows an embodiment of drive wheel 1702 and pressure roller 1704. As shown in FIG. 17C, drive wheel 1702 may comprise multiple sections (e.g., a first section 1714, a second section 1716, a third section 1718, and a fourth section 1720). The multiple sections may be of equal diameter. Pressure roller 1704 may comprise multiple sections (e.g., a fifth section 1722, a sixth section 1724, a seventh section 1726, and an eighth section 1728. The sections of pressure roller 1704 may comprise tenons 1730. Drive wheel 1702 may comprise grooves 1732. During operation, tenons 1730 may nestle within grooves 1732. The tolerances between grooves 1732 and tenons 1730 may be such that during operation the conductors sandwiched between the pressure roller 1704 and drive wheel 1702 have very little room to move vertically or laterally. The tight tolerances may also help to prevent damage to the conductors and any sheathing that may cover the conductors. In addition, the tight tolerances help to ensure that a consistent length of conductor is being fed with each revolution of the drive wheel 1702.

Multiple conductors (e.g., a first conductor 1734, a second conductor 1736, a third conductor 1738, and a fourth conductor 1740) may pass between drive wheel 1702 and pressure roller 1704. During installation of the multiple conductors into multiple conductor container assembly 100, drive wheel 1702 may rotate at a predetermined speed. Depending on the diameter of drive wheel 1702, each revolution of drive wheel 1702 may advance a given amount to the multiple conductors. For example, the multiple sections of drive wheel 1702 may have a diameter of six-inches. For a six-inch diameter, the drive wheel may advance the multiple conductors approximately 19 inches per revolution. Grooves 1732 and tenons 1730 may be coated with a material (e.g., rubber) to help increase friction between drive wheel 1702 and the multiple conductors.

The multiple sections of drive wheel 1702 may rotate in unison or they may rotate independently of each other. For example, the multiple sections of drive wheel 1702 may share a common axel 1742. One revolution of axel 1742 may cause each of the multiple sections to rotate one revolution. Each of the multiple sections may also rotate on respective independent axes (not shown). For example, first section 1714 may be connected to a first axis (not shown) that may be driven by a first motor (not shown), second sections 1716 may be connected to a second axis (not shown) that may be driven by a second motor (not shown), etc. Because the multiple sections are independent of each other, the speed of each may be increased or decreased without affecting the speed of others. In addition to a single drive wheel, embodiments may comprise multiple drive wheels and multiple pressure rollers.

Figure 17D:
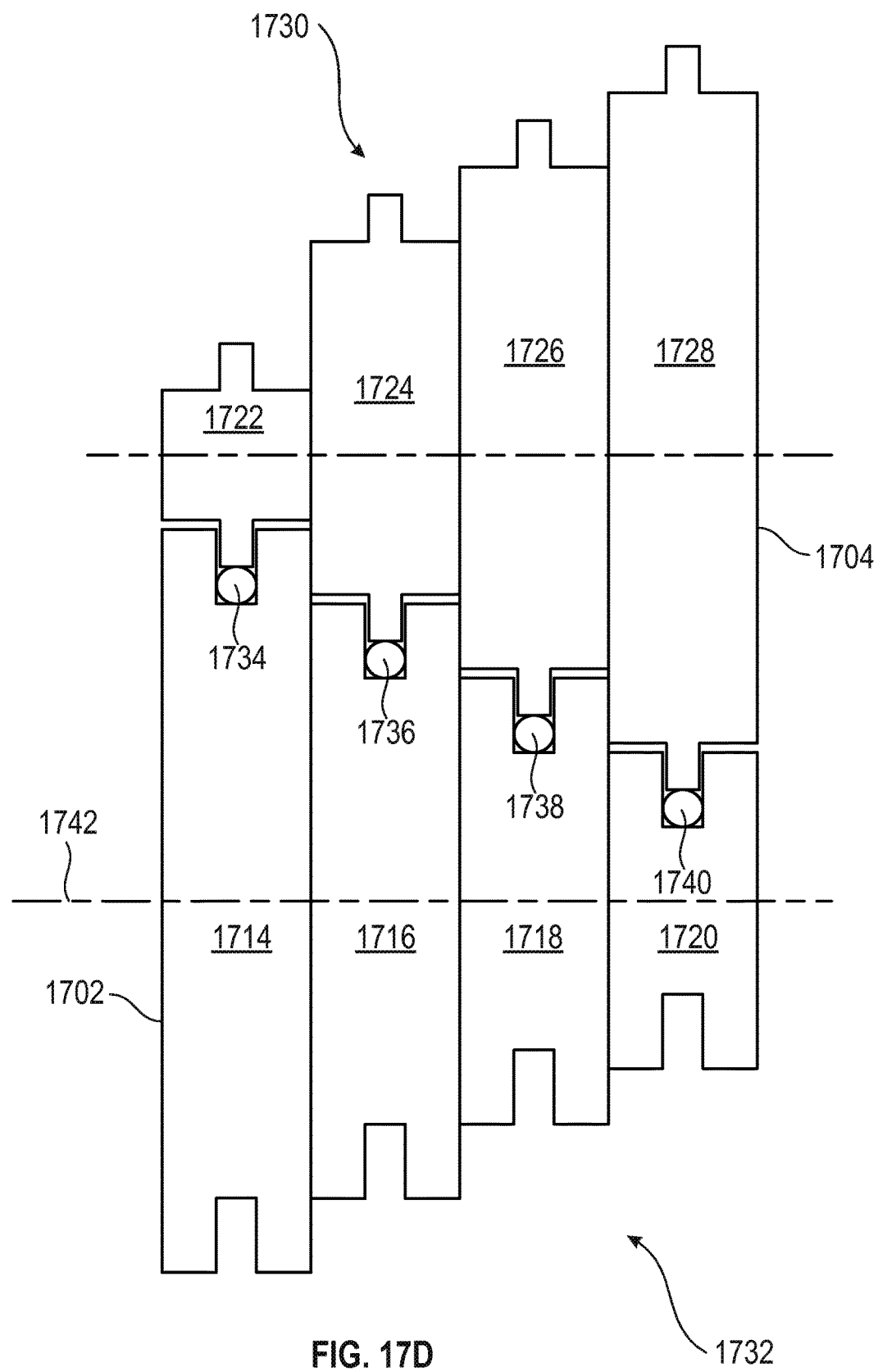

FIG. 17D shows an embodiment of drive wheel 1702 and pressure roller 1704. As shown in FIG. 17D, drive wheel 1702 may comprise multiple sections (e.g., first section 1714, second section 1716, third section 1718, and fourth section 1720). The multiple sections may be of unequal diameter. For example, first section 1714 may be six-inches in diameter and fourth section 1720 may be three-inches in diameter. Pressure roller 1704 may comprise multiple sections (e.g., fifth section 1722, sixth section 1724, seventh section 1726, and eighth section 1728. The sections of pressure roller 1704 may comprise tenons 1730. Drive wheel 1702 may comprise grooves 1732. During operation the tenons 1730 may nestle within grooves 1732.

Multiple conductors (e.g., first conductor 1734, second conductor 1736, third conductor 1738, and fourth conductor 1740) may pass between drive wheel 1702 and pressure roller 1704. During installation of the multiple conductors into multiple conductor container assembly 100, drive wheel 1702 may rotate at a predetermined speed. Depending on the diameter of each section of drive wheel 1702, each revolution of drive wheel 1702 may advance a given amount to the multiple conductors. For example, first section 1714 of drive wheel 1702 may have a diameter of six-inches and fourth section of drive wheel 1702 may have a diameter of three-inches. For the six-inch diameter first section 1714 may advance first conductor 1734 approximately 19 inches per revolution and the three-inch diameter fourth section 1720 may advance fourth conductor 1740 approximately 9.5 inches per revolution. Grooves 1732 and tenons 1730 may be coated with a material (e.g., rubber) to help increase friction between drive wheel 1702 and the multiple conductors.

The multiple sections of drive wheel 1702 may rotate in unison or they may rotate independently of each other. For example, the multiple sections of drive wheel 1702 may share a common axel 1742. One revolution of axel 1742 may cause each of the multiple sections to rotate one revolution. Each of the multiple sections may also rotate on respective independent axes (not shown). For example, first section 1714 may be connected to a first axis (not shown) that may be driven by a first motor (not shown), second sections 1716 may be connected to a second axis (not shown) that may be driven by a second motor (not shown), etc. Because the multiple sections are independent of each other, the speed of each may be increased or decreased without affecting the speed of others. In addition to a single drive wheel, embodiments may comprise multiple drive wheels and multiple pressure rollers.

FIGS. 18A and 18B show a method and configuration that may be implemented to lay multiple conductors in multiple conductor container assembly 100 with first conductor 202 and second conductor 204. In the embodiment shown in FIG. 18A, multiple conductor container assembly 100 may be located proximate feed tube 1708. Feed tube 1708 may feed first conductor 202 and second conductor 204 at a constant or variable speed as indicated by arrow 1804. While first conductor 202 and second conductor 204 is being fed from feed tube 1708, multiple conductor container assembly 100 may be rotated about an axis 1806 as indicated by arrow 1808. During loading of multiple conductor container assembly 100 with first conductor 202 and second conductor 204, the rotational speed of multiple conductor container assembly 100 may be constant or variable.

Consistent with embodiments of the invention, feed tube 1708 may feed first conductor 202 and second conductor 204 at a constant speed and multiple conductor container assembly 100 may rotate at a constant speed. In addition, feed tube 1708 may feed first conductor 202 and second conductor 204 at a variable speed and multiple conductor container assembly 100 may rotate at a constant speed. Furthermore, feed tube 1708 may feed first conductor 202 and second conductor 204 at a variable speed and multiple conductor container assembly 100 may rotate at a constant speed. Moreover, consistent with embodiments of the invention, feed tube 1708 may feed first conductor 202 and second conductor 204 at a variable speed and multiple conductor container assembly 100 may rotate at a variable speed. By varying the feed first conductor 202 and second conductor 204 and/or the speed at which multiple conductor container assembly 100, the placement location of first conductor 202 and second conductor 204 in multiple conductor container assembly 100 may be controlled.

Also, during manufacturing, feed tube 1708 may be stationary or it too, may rotate. For example, consistent with embodiments of the invention, both feed tube 1708 and multiple conductor container assembly 100 (as indicated in FIG. 18A by assembly 1810) may rotate about axis 1812 as indicated by arrow 1814. While assembly 1810 may be rotating about axis 1812, multiple conductor container assembly 100 may or may not be rotating about axis 1806 as described above. In this way, the placement location of first conductor 202 and second conductor 204 in multiple conductor container assembly 100 may be controlled. In addition and as described above the feed rate for feed tube 1708 may be constant or variable and the rotation of multiple conductor container assembly 100 about axis 1806 may be constant or variable.

In addition, while FIGS. 18A and 18B show two cables (first conductor 202 and second conductor 204) being installed in multiple conductor container assembly 100, there may be a second cable feeding assembly that may feed a third cable or feed tube 1708 may feed a third cable. For instance, FIG. 2 shows first conductor 202 and second conductor 204 located in multiple conductor container assembly 100. To achieve this configuration, there may be a second feed tube that lays the third conductor simultaneously with first conductor 202 and second conductor 204. Or each cable located in multiple conductor container assembly 100 may be laid down in separate stages. For example, first conductor 202 may be loaded in multiple conductor container assembly 100 at a first loading stage and second conductor 204 may be loaded in multiple conductor container assembly 100 at a second loading stage.

Figure 19:
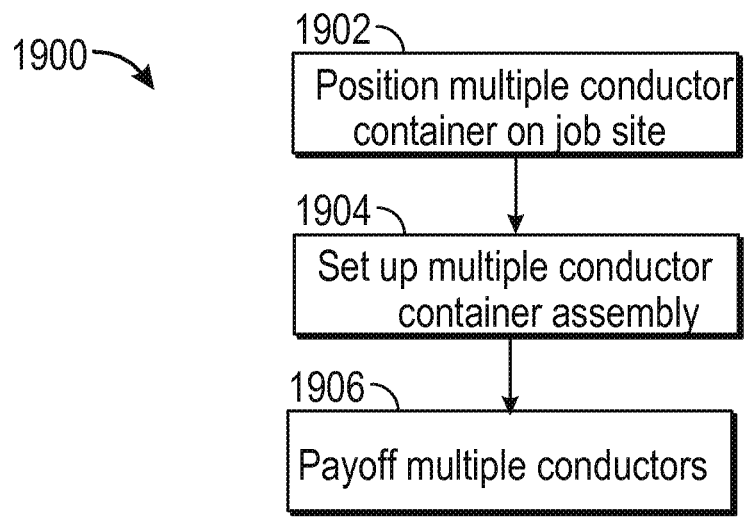
FIG. 19 shows a flow chart of a method of using a container including multiple conductors.

FIG. 19 shows a flow chart for a method 1900 for using multiple conductor container assembly 100. In other words, FIG. 19 shows a flow chart for method 1900 where a non-rotating container is use to payoff multiple conductors. Method 1900 may begin at stage 1902 where multiple conductor container assembly 100 may be positioned at a job site. For example, multiple conductor container assembly 100 may be placed in a desired location using a cart as described in U.S. Patent Application having Ser. No. 61/536,786, which is hereby incorporated by reference in its entirety.

After multiple conductor container assembly 100 is located at the job site, method 1900 may proceed to stage 1904 where a user may set up multiple conductor container assembly 100. For example, the user may feed first conductor 202 and second conductor 204 from multiple conductor container assembly 100 through container tap wire guide 302. From container tap wire guide 302 the user may connect the multiple conductors to a pulling apparatus (e.g., electrician's fish tape).

After setting up multiple conductor container assembly 100, the user may payoff the multiple conductors from multiple conductor container assembly 100. For example, the user may pull the fish tape through a conduit. As the fish tape is pulled through the conduit, the multiple conductors may payoff from multiple conductor container assembly 100 and be pulled through the conduit.

Figure 20:
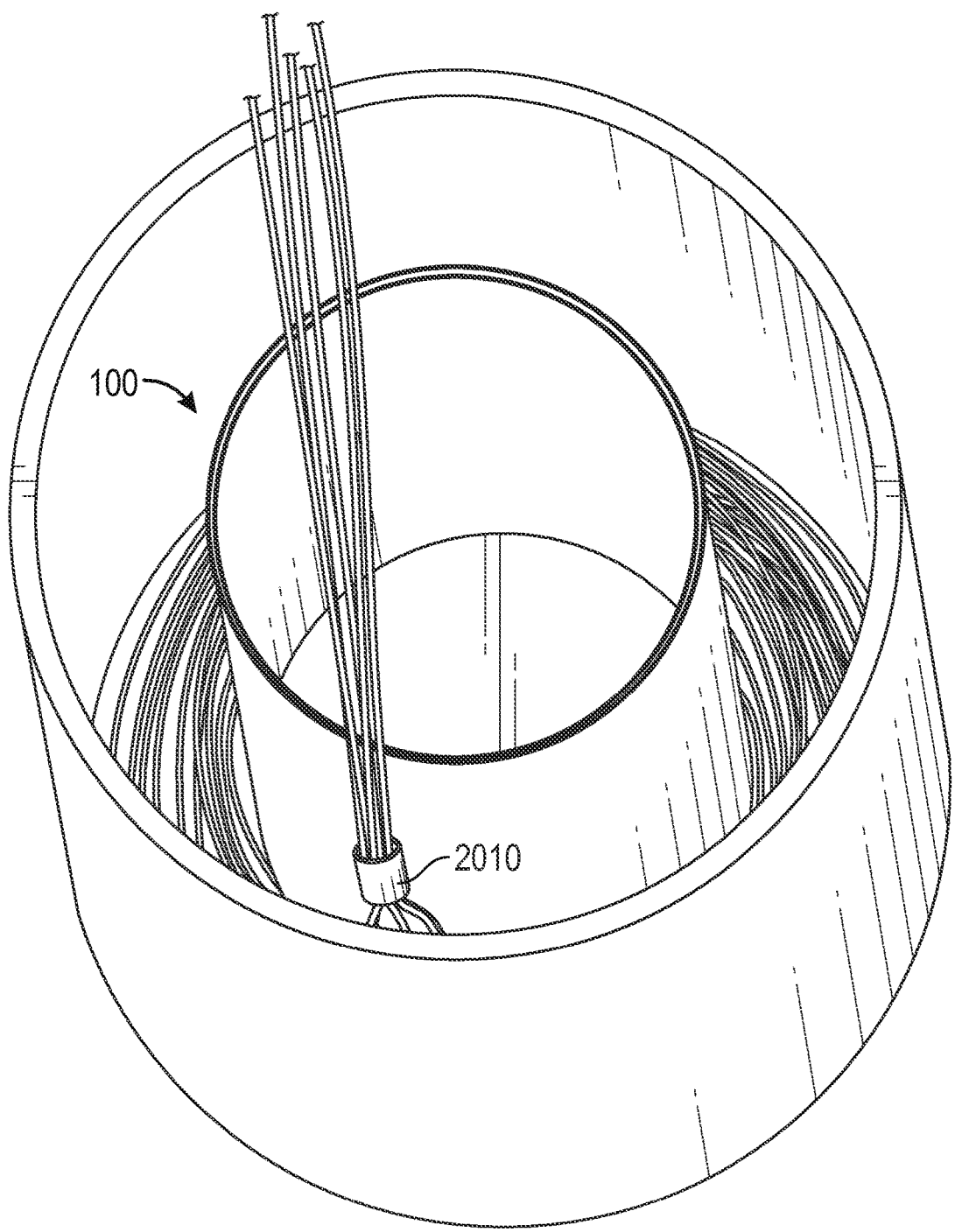
FIG. 20 shows a multiple conductor container assembly and a coupler.

FIG. 20 shows the multiple conductor container assembly 100 and a coupler 2010 through which the multiple conductors may pass as the multiple conductors payoff from multiple conductor container assembly 100. As shown in FIG. 20, each of the multiple conductors may have varying lengths prior to passing through the coupler 2010. This may cause at least one of the multiple conductors to form a bow prior to passing through the coupler 2010. As the multiple conductors pass through the coupler 2010, a bow that exists prior to passing through the coupler 2010 is not allowed to pass. This may restrict the multiple conductors to pass through the coupler 2010 at the same rate, and equivalently, at the same length. Furthermore, the coupler 2010 may assist in indicating a tangle within the multiple conductors coming as they come out of the multiple conductor container assembly 100. If a conductor should become tangled, the coupler 2010 may correct a tangle in the conductor once it has happened. The coupler 2010 may also identify which conductors are too short or too long in comparison to the multiple conductors passing through the coupler 2010. Moreover, the coupler 2010 allows a central point to true the wires back together. The coupler 2010 may be arranged such that it remains within multiple conductor container assembly 100 when the multiple individually sheathed conductors are paying off from such assembly. More specifically, the coupler 2010 may be arranged such that it remains below the top edge of the core centered within the multiple conductor container assembly 100.

Figure 21:
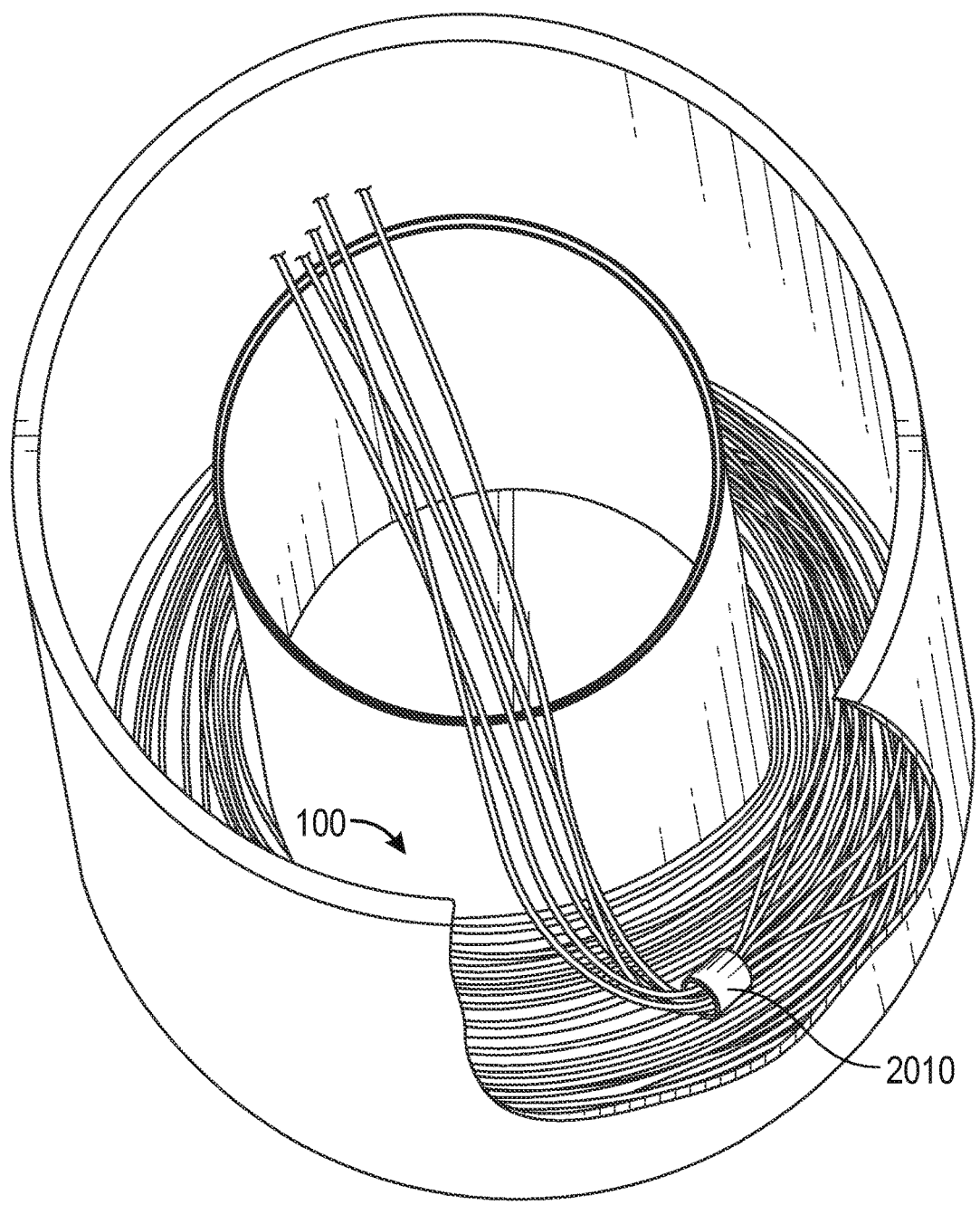
FIG. 21 shows a multiple conductor container assembly and a coupler.

As shown in FIG. 21, the coupler 2010 may be located amongst the layered multiple individually sheathed conductors within the multiple conductor container assembly 100. In FIG. 21, the multiple individually sheathed conductors may be coupled prior to the conductors paying off through the opening of the multiple conductor container assembly 100. Coupling or restricting the multiple conductors prior to the conductors paying off through the opening of the multiple conductor container assembly 100 may provide a constant grouping point on multiple conductors while moving within the multiple conductor container assembly 100. As the multiple individually sheathed conductors payoff, the coupler 2010 may move within the multiple conductor container assembly 100 as the container assembly remains stationary. The coupler 2010 in FIG. 21 also may act as an indicator or correct point to lift conductors out of the multiple conductor container assembly 100 if an end of a conductor is dropped back into the multiple conductor container assembly 100 by mistake.

The coupler 2010 may comprise any suitable material strong enough to contain the multiple individually sheathed conductors as such conductors pass through coupler 2010 but light enough to not impose an additional burden on paying off such conductors from the multiple conductor container assembly 100. For example, the coupler 2010 may comprise plastic, including polyvinyl chloride, aluminum, copper, silicon, or any combination thereof. Likewise, the coupler 2010 may maintain a smooth inner surface so as to not create friction and wear-and-tear on the multiple conductors as the multiple conductors pass through coupler 2010. Furthermore, while the coupler 2010 is shown in FIGS. 20-21 as being circular, embodiments may comprise other shapes. For example, the coupler 2010 may be square, rectangular, spherical, or any other appropriate shape. Moreover, the coupler 2010 may comprise various lengths, inner diameters, and outer diameters. Preferably, a length of the coupler 2010 may be between 0.5"-4" or other varying lengths. More preferably, a length of the coupler 2010 may be between 1"-2.5". In addition, more than one coupler 2010 may be employed to couple the multiple conductors paying off from multiple conductor container assembly 100.

As indicated above, the coupler 2010 may be implemented in the multiple conductor container assembly 100 to payoff multiple individually sheathed conductors. A non-rotating multiple conductor container assembly 100 may be used to payoff multiple conductors. After the multiple conductor container assembly 100 is placed in a desired location using a cart, a user may prepare the multiple conductor container assembly 100 for payoff. For example, the user may feed first conductor and second conductor through coupler 2010 as part of the payoff of these conductors from multiple conductor container assembly 100.

Embodiments, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present invention may be embodied in hardware and/or in software (including firmware, resident software, microcode, etc.). In other words, embodiments of the present invention may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments have been described, other embodiments may exist. Furthermore, although embodiments have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the invention.

Embodiments, for example, are described above with reference to block diagrams and/or operational illustrations of methods, systems, and computer program products according to embodiments of the invention. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

Both the foregoing general description and the following detailed description are examples and explanatory only, and should not be considered to restrict the invention's scope, as described and claimed. Further, features and/or variations may be provided in addition to those set forth herein. For example, embodiments may be directed to various feature combinations and sub-combinations described herein.

While certain embodiments of the invention have been described, other embodiments may exist. While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as examples for embodiments of the invention.

What is claimed is:

1. A container comprising:
   a first surface;
   a second surface projecting from the first surface, the second surface defining a core, the core having a plurality of individually sheathed conductors layered thereabout; and
   a restricting mechanism through which the plurality of individually sheathed conductors pass wherein the restricting mechanism is configured to move within the container while the container remains stationery.

2. A container comprising:
   a first surface;
   a second surface projecting from the first surface, the second surface defining a core, the core having a plurality of individually sheathed conductors layered thereabout; and
   a restricting mechanism through which the plurality of individually sheathed conductors pass wherein the restricting mechanism remains below the top edge of the core when the plurality of individually sheathed conductors are paying off from the container.

3. A container comprising:
   a first surface;
   a second surface projecting from the first surface, the second surface defining a core, the core having a plurality of individually sheathed conductors layered thereabout; and
   a restricting mechanism through which the plurality of individually sheathed conductors pass wherein the restricting mechanism remains within the container when the plurality of individually sheathed conductors are paying off from the container.

4. The container of claim 3, wherein the restricting mechanism restricts the plurality of individually sheathed conductors to pass at an equal length.

5. The container of claim 3, wherein the restricting mechanism restricts the plurality of individually sheathed conductors to pass at an equal rate.

6. The container of claim 3, wherein the restricting mechanism remains below a top edge of the core when the plurality of individually sheathed conductors are paying off from the container.

7. The container of claim 3, wherein the restricting mechanism is configured to move within the container while the container remains stationery.

8. The container of claim 3, wherein the restricting mechanism comprises a length between 0.5 inches and four inches.

9. The container of claim 3, wherein the restricting mechanism comprises a length between one inch and 2.5 four inches.

10. A container comprising:
a first surface;
at least one other surface associated with the first surface, the first surface and the at least one other surface defining a volume that houses a length of multiple individually sheathed conductors layered in parallel in a stacked arrangement within the volume; and
a coupling mechanism through which the multiple individually sheathed conductors pass, wherein the coupling mechanism restricts the multiple individually sheathed conductors to pass at an equal length wherein the coupling mechanism is configured to move within the container while the container remains stationery.

11. A container comprising:
a first surface;
at least one other surface associated with the first surface, the first surface and the at least one other surface defining a volume that houses a length of multiple individually sheathed conductors layered in parallel in a stacked arrangement within the volume;
a coupling mechanism through which the multiple individually sheathed conductors pass, wherein the coupling mechanism restricts the multiple individually sheathed conductors to pass at an equal length; and
a third surface concentric with the second surface, wherein the second surface and the third surface define a second volume for housing a second set of multiple individually sheathed conductors layered in parallel in a stacked arrangement within the second volume.

12. A container comprising:
a first surface;
at least one other surface associated with the first surface, the first surface and the at least one other surface defining a volume that houses a length of multiple individually sheathed conductors layered in parallel in a stacked arrangement within the volume; and
a coupling mechanism through which the multiple individually sheathed conductors pass, wherein the coupling mechanism restricts the multiple individually sheathed conductors to pass at an equal length wherein the coupling mechanism remains below a top edge of the first surface when the multiple individually sheathed conductors are paying off from the container.

13. The container of claim 12, wherein the coupling mechanism restricts the multiple individually sheathed conductors to pass at an equal rate.

14. The container of claim 12, wherein the coupling mechanism remains within the container when the multiple individually sheathed conductors are paying off from the container.

15. The container of claim 12, wherein the coupling mechanism is configured to move within the container while the container remains stationery.

16. The container of claim 12, wherein the coupling mechanism comprises plastic.

17. The container of claim 12, wherein the coupling mechanism comprises metal.

18. The container of claim 12, wherein the coupling mechanism comprises a smooth inner surface.

19. The container of claim 12, wherein the coupling mechanism is circular in shape.

20. The container of claim 12, wherein the coupling mechanism is square in shape.

21. The container of claim 12, wherein the coupling mechanism is rectangular in shape.

22. The container of claim 12, wherein the coupling mechanism is spherical in shape.

23. The container of claim 12, wherein the coupling mechanism comprises a length between 0.5 inches and four inches.

24. The container of claim 12, wherein the coupling mechanism comprises a length between one inch and 2.5 inches.

25. The container of claim 12, wherein the coupling mechanism comprises a length that varies.

26. The container of claim 12, wherein the first surface comprises a conical profile.

27. The container of claim 12, wherein the volume houses at least 500 feet of the multiple individually sheathed conductors.

28. The container of claim 12, wherein sheathing on at least one of the multiple individually sheathed conductors comprises one of the following: an insulation material and a jacket comprising a lubricant material.

29. The container of claim 12, further comprising a third surface concentric with the second surface, wherein the second surface and the third surface define a second volume for housing a second set of multiple individually sheathed conductors layered in parallel in a stacked arrangement within the second volume.

30. The container of claim 12, wherein the multiple individually sheathed conductors are non-bound multiple conductors.

31. The container of claim 12, further comprising a wire guide.

32. The container of claim 12, wherein the container is capable of stacking on top of a second container.

* * * * *